(12) United States Patent
Han et al.

(10) Patent No.: US 12,302,655 B2
(45) Date of Patent: May 13, 2025

(54) DUAL VERTICAL GATE AND IMAGE SENSOR INCLUDING THE SAME

(71) Applicant: SAMSUNG ELECTRONICS CO., LTD., Suwon-si (KR)

(72) Inventors: Dongmin Han, Daegu (KR); Wonhyeok Kim, Hwaseong-si (KR); Seongjoo Nah, Gwangju (KR); Heegeun Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 448 days.

(21) Appl. No.: 17/657,010

(22) Filed: Mar. 29, 2022

(65) Prior Publication Data

US 2023/0022805 A1 Jan. 26, 2023

(30) Foreign Application Priority Data

Jul. 21, 2021 (KR) .................. 10-2021-0096003

(51) Int. Cl.
*H01L 27/146* (2006.01)
*H10F 39/00* (2025.01)
*H10F 39/18* (2025.01)

(52) U.S. Cl.
CPC ....... *H10F 39/80373* (2025.01); *H10F 39/18* (2025.01); *H10F 39/807* (2025.01); *H10F 39/813* (2025.01)

(58) Field of Classification Search
CPC ............... H01L 27/146; H01L 27/1463; H01L 27/14614; H01L 27/14641; H01L 27/14643; H01L 27/14603; H01L 27/14609; H10F 39/00; H10F 39/12; H10F 39/80; H10F 39/95; H10F 39/011; H10F 39/191; H10F 39/196; H10F 39/198; H10F 39/18; H10F 39/014; H10F 39/182; H10F 39/1865; H10F 39/80373; H10D 18/00; H10D 18/211; H10D 62/10; H10D 62/117;
(Continued)

(56) References Cited

U.S. PATENT DOCUMENTS 5,962,882 A 10/1999 Sin
7,364,960 B2 4/2008 Lyu
(Continued)

FOREIGN PATENT DOCUMENTS

KR 10-0192954 2/1999
KR 10-2006-00262 3/2006
(Continued)

*Primary Examiner* — Chuong A Luu
(74) *Attorney, Agent, or Firm* — MORGAN, LEWIS & BOCKIUS LLP

(57) ABSTRACT

An image sensor includes a dual vertical gate. The dual vertical gate includes two vertical extension portions that are spaced apart from each other in a first direction and vertically extend in a second direction perpendicular to the first direction into a substrate, and a connection portion that connects the two vertical extension portions to each other. An element isolation layer is disposed adjacent to a side surface of the vertical extension portion in the first direction. The two vertical extension portions are separated by a separation area that extends in the second direction, and a top surface of the separation area is lower than a top surface of the element isolation layer.

14 Claims, 18 Drawing Sheets

(58) Field of Classification Search
CPC ... H10D 84/80; H10H 20/823; H10H 20/8232
USPC .......................................................... 257/292
See application file for complete search history.

(56) References Cited

U.S. PATENT DOCUMENTS

| | | | |
|---|---|---|---|
| 10,403,673 B2 | 9/2019 | Lee et al. | |
| 2006/0084195 A1* | 4/2006 | Lyu .................... | H01L 27/14603 |
| | | | 257/E27.131 |
| 2013/0076934 A1* | 3/2013 | Maeda .............. | H01L 27/14641 |
| | | | 348/222.1 |
| 2019/0123079 A1 | 4/2019 | Kudoh | |
| 2021/0305298 A1* | 9/2021 | Hu ..................... | H01L 27/14603 |

FOREIGN PATENT DOCUMENTS

| KR | 10-2006-0034926 | 4/2006 |
|---|---|---|
| KR | 10-0746821 | 7/2007 |
| KR | 10-2011-0050351 | 5/2011 |
| KR | 10-2018-0078416 | 7/2018 |

* cited by examiner

DUAL VERTICAL GATE AND IMAGE SENSOR INCLUDING THE SAME

CROSS-REFERENCE TO RELATED APPLICATION

This application claims priority under 35 U.S.C. § 119 from Korean Patent Application No. 10-2021-0096003, filed on Jul. 21, 2021 in the Korean Intellectual Property Office, the contents of which are herein incorporated by reference in their entirety.

TECHNICAL FIELD

Embodiments of the inventive concept are directed to an image sensor, and more particularly, to an image sensor that includes a vertical gate structure.

DISCUSSION OF THE RELATED ART

An image sensor converts an optical image into an electrical signal. Due to recent developments in the computer industry and the communication industry, improved image sensors are desired in various fields such as digital cameras, camcorders, personal communication systems (PCSs), game devices, security cameras, medical micro cameras, and so forth. An image sensor includes a plurality of unit pixels in a two-dimensional (2D) array. In general, a unit pixel includes one photodiode and a plurality of pixel transistors. The pixel transistors include, for example, a transfer transistor, a reset transistor, a source follower transistor, and a selection transistor. Recently, as pixels have been miniaturized, an image sensor that includes a vertical gate structure has been developed.

SUMMARY

Embodiments of the inventive concept provide a dual vertical gate with maximized charge transfer characteristics and an image sensor that includes the dual vertical gate.

According to an embodiment of the inventive concept, there is provided an image sensor that includes a dual vertical gate that includes two vertical extension portions that are spaced apart from each other in a first direction and vertically extend in a third direction perpendicular to the first direction into a substrate, and a connection portion that connects the two vertical extension portions to each other. The image sensor further includes an element isolation layer disposed adjacent to a side surface of the vertical extension portion in the first direction. The two vertical extension portions are separated by a separation area that extends in a second direction perpendicular to the first and third directions, and a top surface of the separation area is lower than a top surface of the element isolation layer.

According to another embodiment of the inventive concept, there is provided an image sensor that includes a substrate, a dual vertical gate disposed on an upper portion of the substrate, a photodiode (PD) disposed under the dual vertical gate inside the substrate, an element isolation layer disposed on the upper portion of the substrate and adjacent to the dual vertical gate in a first direction, and a floating diffusion (FD) region disposed on the upper portion of the substrate and adjacent to the dual vertical gate in a second direction perpendicular to the first direction. The dual vertical gate includes two vertical extension portions that are spaced apart from each other in the first direction and that vertically extend into the substrate in a third direction perpendicular to the first and second directions and a connection portion that connects the two vertical extension portions to each other. The two vertical extension portions are separated from each other by a separation area that extends in the second direction and the third direction, and a top surface of the separation area is lower than a top surface of the element isolation layer.

According to another embodiment of the inventive concept, there is provided an image sensor that includes a substrate, a dual vertical gate disposed on an upper portion of the substrate, a photodiode (PD) disposed under the dual vertical gate inside the substrate, an element isolation layer disposed on the upper portion of the substrate and adjacent to the dual vertical gate in a first direction, a floating diffusion (FD) region disposed on the upper portion of the substrate and adjacent to the dual vertical gate in a second direction perpendicular to the first direction, and a transistor (TR) region that includes at least one transistor. The dual vertical gate includes two vertical extension portions that are spaced apart from each other in the first direction and that vertically extend into the substrate in a third direction perpendicular to the first and second directions and a connection portion that connects the vertical extension portions to each other.

DETAILED DESCRIPTION

Figure 1:
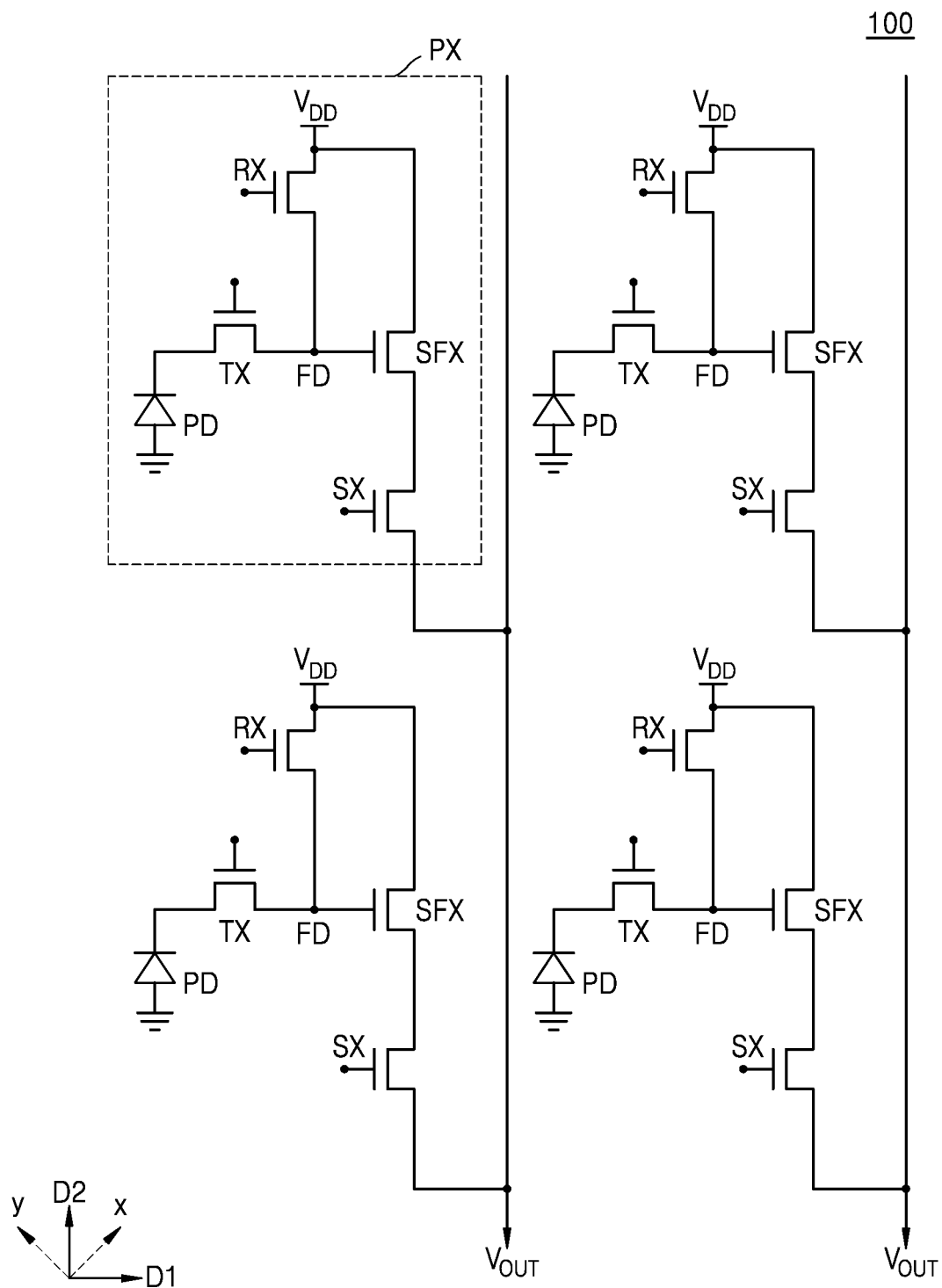
FIG. 1 is a circuit diagram of some pixels of an image sensor that includes a dual vertical gate, according to an embodiment of the inventive concept.

Hereinafter, embodiments of the inventive concept will be described in detail with reference to the accompanying drawings. Like components in the drawings may be referred to as like reference numerals, and might not be repeatedly described.

FIG. 1 is a circuit diagram of some pixels of an image sensor that includes a dual vertical gate, according to an embodiment of the inventive concept.

Referring to FIG. 1, an image sensor 100 that includes a dual vertical gate according to an embodiment of the inventive concept, hereinafter referred to as an 'image sensor', further includes a plurality of pixels PXs arranged in a two-dimensional (2D) array structure. For example, the pixels PXs are arranged in a 2D array structure in two diagonal directions between a first direction (an x direction) and a second direction (a y direction), i.e., a first diagonal direction D1 and a second diagonal direction D2. Such pixels PXs in a 2D array structure constitute an active pixel sensor (APS).

Each of the pixels PXs includes a photodiode PD, a floating diffusion region FD, and pixel transistors. For example, the pixel transistors include a transfer transistor TX, a reset transistor RX, a source follower transistor SFX, and a selection transistor SX. Such pixel transistors are formed on a front side FS, shown in FIG. 2B of a substrate 101, shown in FIG. 2B. For example, the pixel transistors are connected to a wiring layer formed on a front side FS of a substrate 101 via a contact.

The photodiode PD generates and accumulates charges in proportion to the amount of light incident thereon. For reference, an element that transforms light into charges is generally referred to as a photoelectric transformation element, and the photodiode PD corresponds to a type of photoelectric transformation element. In the image sensor 100 according to an embodiment of the inventive concept, the photoelectric transformation element in the pixel PX is not limited to the photodiode PD. For example, according to an embodiment of the inventive concept, a different type of a photoelectric transformation element, such as a phototransistor, a photogate, a pinned-photodiode, or a combination thereof, etc., may be included in the pixel PX.

Figure 2A:
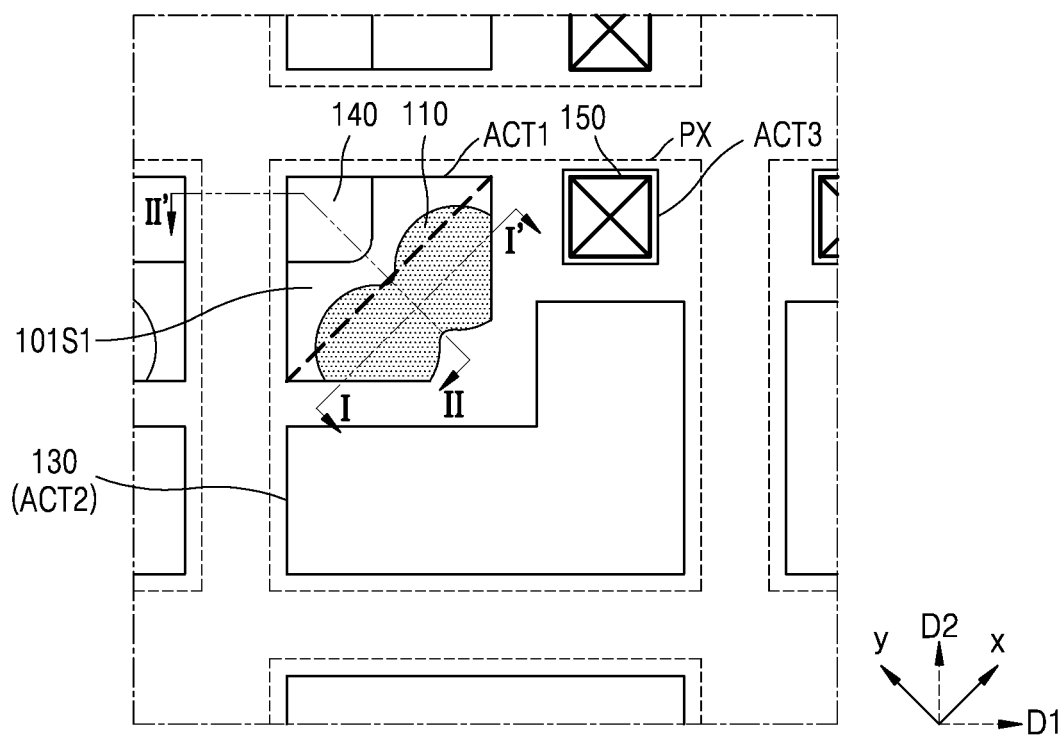
FIGS. 2A through 2D are a plan view and cross-sectional views of a pixel of an image sensor that includes a dual vertical gate, according to an embodiment of the inventive concept, and a cross-sectional view of a comparative example.

In addition, in the image sensor 100 according to an embodiment of the inventive concept, the transfer transistor TX includes a dual vertical gate 110, shown in FIG. 2A. The transfer transistor TX transmits charges generated in the photodiode PD to the floating diffusion region FD. The transfer transistor TX and the dual vertical gate 110 will be described in more detail below with reference to FIGS. 2A through 2D.

The floating diffusion region FD receives the charges generated in the photodiode PD, and accumulates and stores the received charges. The source follower transistor SFX is controlled by the amount of charges accumulated in the floating diffusion region FD. The reset transistor RX periodically resets the charges accumulated in the floating diffusion region FD. A drain of the reset transistor RX is connected to the floating diffusion region FD, and a source of the reset transistor RX is connected to a power voltage $V_{DD}$. When the reset transistor RX is turned on, the power voltage $V_{DD}$ connected to the source of the reset transistor RX is provided to the floating diffusion region FD. Thus, the charges accumulated in the floating diffusion region FD are discharged such that the floating diffusion region FD is reset.

The source follower transistor SFX corresponds to a source follower buffer amplifier. That is, the source follower transistor SFX amplifies a potential change by the amount of charge of the floating diffusion region FD, and outputs the corresponding power voltage $V_{DD}$ to an output line VOUT through the selection transistor SX. The selection transistor SX selects the pixels PXs to be read row-by-row. When the selection transistor SX is turned on, the power voltage $V_{DD}$ provided to a drain electrode of the source follower transistor SFX is output through the source follower transistor SFX and the selection transistor SX.

Figure 2B:
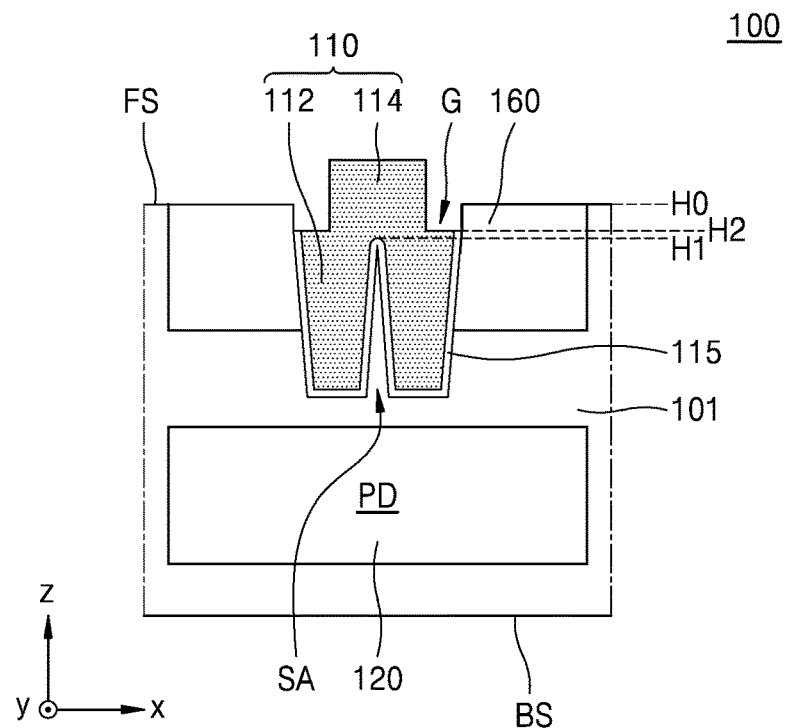
Figure 2C:
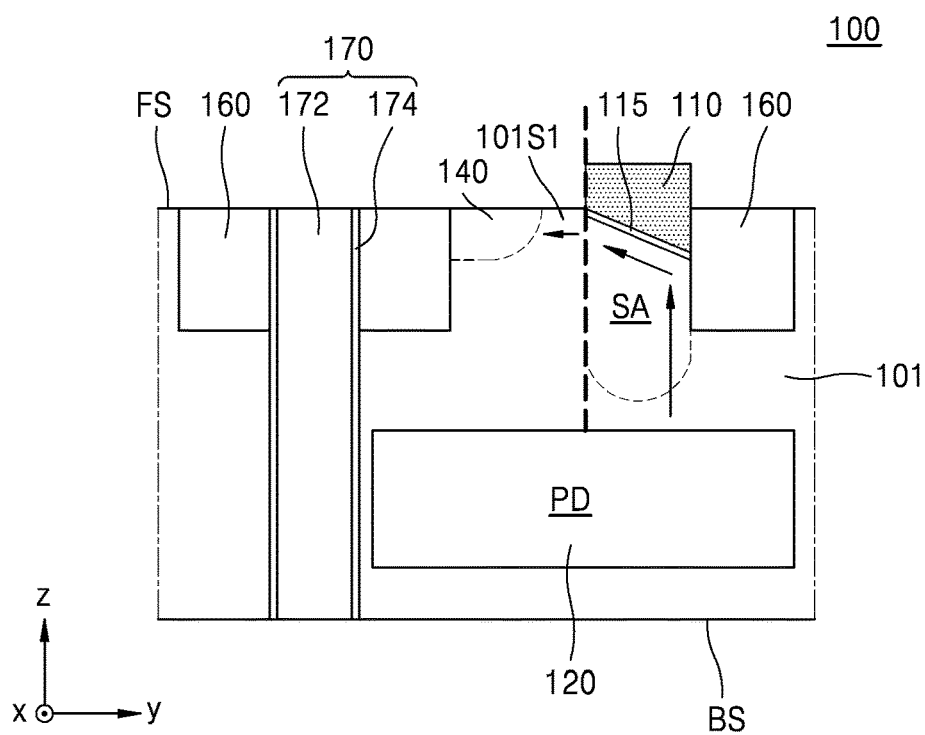
Figure 2D:
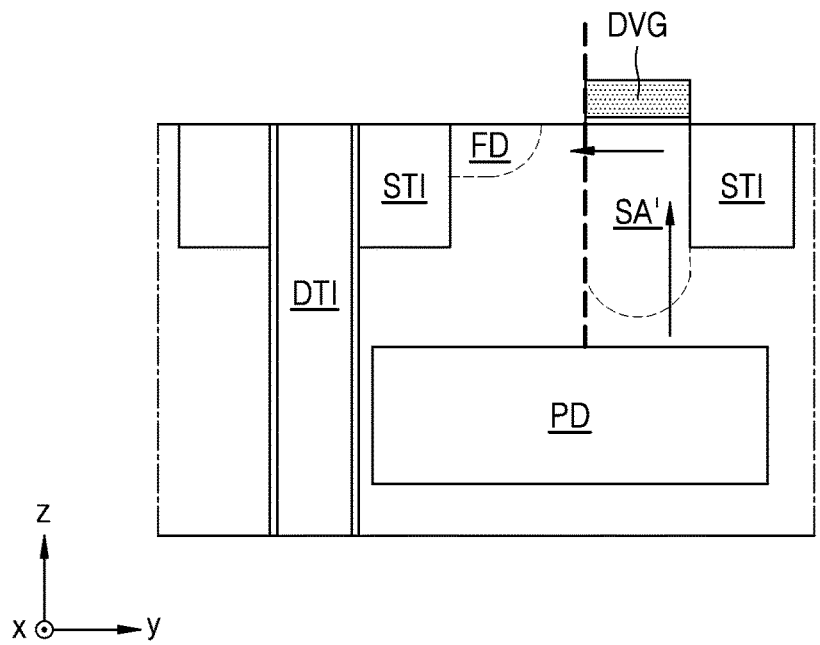

FIGS. 2A through 2D are a plan view and cross-sectional views of a pixel of an image sensor that includes a dual vertical gate, according to an embodiment of the inventive concept, and a cross-sectional view of a comparative example. FIGS. 2B and 2C are cross-sectional views taken along lines I-I' and II-II' of FIG. 2A, and FIG. 2D is a cross-sectional view corresponding to FIG. 2C as a comparative example.

Referring to FIGS. 2A through 2D, the image sensor 100 according to an embodiment of the inventive concept includes a substrate 101, a dual vertical gate 110, a photodiode 120, a transistor (TR) region 130, and an FD region 140.

The substrate 101 includes the front side FS and a back side BS opposite to the front side FS. The wiring layer is disposed on the front side FS of the substrate 101, and a light transmission layer is disposed on the back side BS of the substrate 101. The light-transmission layer includes, for example, a color filter, a micro lens, etc. Light is incident on the photodiode PD 120 through the light transmission layer of the back side BS of the substrate 101. In general, in an image sensor, a structure in which the wiring layer and the light transmission layer are disposed on opposite sides of the substrate 101, such as a structure in which the wiring layer is disposed on the front side FS of the substrate 101 and the light transmission layer is disposed on the back side BS of the substrate 101, is referred to as a back side illumination (BSI) structure. On the other hand, a structure in which the wiring layer and the light transmission layer are disposed on the same side of the substrate, such as the front side FS of the substrate 101, is referred to as a front side illumination (FSI) structure.

The substrate 101 is formed of an epitaxial layer of a first conductivity type, such as a p type, disposed on a bulk silicon substrate of the first conductivity type. In addition, according to an embodiment of the inventive concept, the bulk silicon substrate is removed from the substrate 101 and only the epitaxial layer may remain on the substrate 101. In addition, in some embodiments, the substrate 101 is a bulk silicon substrate that includes wells of the first conductivity type. On the other hand, in some embodiments, the substrate 101 includes various types of substrates, such as a substrate that includes an epitaxial layer of a second conductivity type, such as an n type, a silicon on insulator (SOI) substrate, etc.

The substrate 101 includes a plurality of pixels PXs separated by a pixel isolation structure 170. In FIG. 2A, in an embodiment, a portion indicated by a dashed line corresponds to one pixel PX surrounded by the pixel isolation structure 170. As described above, the pixels PXs are arranged in a 2D array structure that constitutes the APS.

The pixel isolation structure 170 prevents charges generated by light incident on a specific pixel PX from entering an adjacent pixel PX. That is, the pixel isolation structure 170 prevents crosstalk between adjacent pixels PXs. In a plan view, the pixel isolation structure 170 has a grid shape that completely surrounds each of the pixels PXs. As shown in FIG. 2C, in an embodiment, the pixel isolation structure 170 extends from the front side FS of the substrate 101 to the back side BS of the substrate 101 and penetrates through the substrate 101.

The pixel isolation structure 170 includes a conductive layer 172 and an insulation layer 174. The conductive layer 172 is disposed in a central portion of the pixel isolation structure 170 and is formed of, for example, polysilicon doped with impurities. A ground or negative voltage is applied to the conductive layer 172. As the ground or negative voltage is applied to the conductive layer 172, positive charges generated in the pixel PX are removed through the conductive layer 172. As a result, dark current characteristics of the image sensor 100 are reduced through the conductive layer 172 of the pixel isolation structure 170.

The insulation layer 174 is disposed on an outer portion of the pixel isolation structure 170 in a shape that surrounds the conductive layer 172. The insulation layer 174 insulates the conductive layer 172 from the substrate 101. The insulation layer 174 includes, for example, at least one of a silicon oxide film, a silicon oxynitride film, or a silicon nitride film, etc.

According to an embodiment of the inventive concept, a buried layer is formed inside the conductive layer 172. The buried layer prevents the formation of voids in the pixel isolation structure 170 and offsets tensile stress applied to the substrate 101 during a high-temperature process to prevent bending of the substrate 101. As a result, the buried layer is formed of a material that has a thermal expansion coefficient that differs from that of the conductive layer 172. For example, the buried layer includes a metal oxide, a metal nitride, a metal, or a combination thereof. However, embodiments are not limited thereto, and in some embodiments, the buried layer is formed of a silicon compound such as SiCN, SiON, or SiOC, etc.

In addition, the pixel isolation structure 170 is formed by forming a deep trench in the substrate 101 and filling the trench with an insulating material and a conductive material. As a result, the pixel isolation structure 170 may also be referred to as a deep trench isolation (DTI) structure. Hence, the pixel isolation structure 170 may be classified as an FDTI (front DTI) structure or a BDTI (back DTI) structure, depending on whether the trench is formed in the front side FS or the back side BS of the substrate 101. The pixel isolation structure 170 has various shapes that depend on the shape of the trench. For example, depending on an embodiment of the inventive concept, the pixel isolation structure 170 might not completely penetrate the substrate 101. In some embodiments, the pixel isolation structure 170 has a structure that penetrating an element isolation layer 160, described below, and in other embodiment, has a structure that contacts a bottom surface of the element isolation layer 160 without penetrating the element isolation layer 160.

The photodiode PD 120 generates and accumulates charges in proportion to the intensity of light incident through the back side BS of the substrate 101, for example, the amount of incident light, as described above. The photodiode PD 120 includes a first impurity region doped with impurities of the first conductivity type, such as p type, and a second impurity region doped with impurities of the second conductivity type, such as an n type. The first impurity region and the second impurity region constitute a p-n junction. According to an embodiment of the inventive concept, the substrate 101 serves as the first impurity region. In this case, the substrate 101 and the second impurity region constitute the photodiode PD 120 without a need to separately form the first impurity region. The photodiode PD 120 is arranged inside the substrate 101 in a central portion of each of the pixels PXs. For example, as shown in FIGS. 2B and 2C, the photodiode PD 120 is formed inside the substrate 101 under the dual vertical gate 110 of the transfer transistor TX.

The element isolation layer 160 that defines active regions is disposed on the front side FS of the substrate 101. The active regions include a first active region ACT1 in which the dual vertical gate 110 and the FD region 140 are formed, a second active region ACT2 that corresponds to the TR region 130, and a third active region ACT3 in which a ground contact 150 is formed. In FIG. 2A, in an embodiment, portions surrounded by a solid line inside the pixel PX correspond to active regions.

The bottom surface of the element isolation layer 160 is spaced vertically apart from the photodiode PD. Here, vertical means a third direction (a z direction) perpendicular to the top surface of the substrate 101. A depth of the element isolation layer 160 is less than a depth of the pixel isolation structure 170. The element isolation layer 160 is, for example, a shallow trench isolation (STI) layer. The pixel isolation structure 170 overlaps a portion of the element isolation layer 160. For example, as shown in FIG. 2C, the pixel isolation structure 170 extends through the element isolation layer 160.

When viewed in a plan view, the first active region ACT1 is located on the left side in the second direction (y direction) inside the pixel PX, and the second active region ACT2 is located on the right side in the second direction (y direction). In addition, the third active region ACT3 is located on the right side in the first direction (x-direction). The second active region ACT2 has an L-shape, but the shape of the second active region ACT2 is not limited thereto. For example, in other embodiments, the second active region ACT2 has a line shape that extends in the first diagonal direction D1.

The transfer transistor TX and the FD region 140 are formed in the first active region ACT1. The transfer transistor TX includes the dual vertical gate 110. For reference, when considering the functional aspect of a transistor, the dual vertical gate 110, the photodiode PD 120 or a portion of the substrate 101 that includes the photodiode PD 120, and the FD region 140 or a portion of the substrate 101 that includes the FD region 140 constitute the transfer transistor TX. In other words, the photodiode 120 and the FD region 140 respectively constitute a source and drain of the transfer transistor TX.

The dual vertical gate 110 includes two vertical extension portions 112 and a connection portion 114. Each of the two vertical extension portions 112 extends vertically into the substrate 101 and are spaced apart from each other in the first direction (x-direction) by a separation area SA. The connection portion 114 connects the two vertical extension portions 112. The vertical extension portion 112 and the connection portion 114 are formed of the same material and are integrally formed. For example, the vertical extension portion 112 and the connection portion 114 are integrally formed of polysilicon. In addition, a gate insulation layer 115 is formed between the dual vertical gate 110 and the substrate 101.

As shown in FIG. 2B, in an embodiment, a cross-section of the separation area SA perpendicular to the second direction (the y direction) has a triangular shape. That is, the separation area SA has a width in the first direction (the x direction) that decreases toward an upper portion of the substrate 101 in the third direction (the z direction). In addition, a first height H1 of a top surface of the separation area SA is lower than a reference height H0 of a top surface of the element isolation layer 160. The reference height H0 is, for example, substantially equal to the height of the front side FS of the substrate 101. In addition, the separation area SA is a portion of the substrate 101. That is, the separation area SA is filled with silicon of the substrate 101.

As shown in FIG. 2A, in an embodiment, the dual vertical gate 110 has a horizontal cross-section in the shape of a peanut. In other words, the horizontal cross-section of the dual vertical gate 110 has a concave shape on both sides of a central portion in the first direction (the x direction). Here, the horizontal cross-section of the dual vertical gate 110 taken at a level higher than the first height H1. When the horizontal cross-section of the dual vertical gate 110 is taken at a level lower than or the same as the first height H1, the horizontal cross-section of the dual vertical gate 110 has a shape of two circles that are spaced apart from each other in the first direction (the x direction). This is because, at or below the first height H1, the vertical extension portion 112 is separated by the separation area SA, such that the separation area SA appears between two circular shapes in a horizontal cross-section taken at a level lower than or the same as the first height H1.

As shown in FIG. 2C, in an embodiment, the top surface of the separation area SA is slanted with a height that gradually increases in the second direction (the y direction). For example, the FD region 140 is located on the left side in the second direction (the y direction) and the element isolation layer 160 is located on the right side in the second direction (the y direction), and the top surface of the separation area SA is slanted with a height that gradually increases from the element isolation layer 160 toward the FD region 140 in the second direction (the y direction). In FIG. 2A, the thick dashed line indicates the outermost portion of the dual vertical gate 110 in the second direction (the y direction) from the central portion of the dual vertical gate 110, for example, the central portion of the peanut. As may be seen from the thick dashed line of FIG. 2C, the top surface of the separation area SA has a height closest to the FD region 140 that is close to or substantially the same as the reference height H0, which is the height of the top surface of the element isolation layer 160. In addition, the curved dashed line above the photodiode PD 120 of FIG. 2C indicates a bottom surface portion of the vertical extension portion 112 of the dual vertical gate 110.

For reference, referring to FIG. 2D, a structure of a dual vertical gate DVG will be considered in which the entire top surface of a separation area SA' is substantially the same as the top surface of an element isolation layer STI in the second direction (the y direction). First, in a cross-section of the dual vertical gate DVG that corresponds to FIG. 2B, the top surface of the separation area SA' is at substantially the same level as the top surface of the element isolation layer STI, and the separation area SA' has a top surface that is flat rather than slanted. Moreover, the width of the separation area SA' is larger than that of the separation area SA in the first direction (the x direction). For example, the average width in the first direction (the x direction) of the separation area SA' of the dual vertical gate DVG of FIG. 2D is greater than that of the separation area SA of the dual vertical gate 110 of the image sensor 100 according to an embodiment of the inventive concept.

In addition, in an embodiment, a horizontal cross-section of the dual vertical gate DVG of FIG. 2D has a peanut shape at a level higher than the top surface of an element separation layer STI. However, at a level that is the same as or lower than the top surface of the element isolation layer STI, the horizontal cross-section of the dual vertical gate DVG has a shape of two circles that are spaced apart from each other by the separation area SA'.

The dual vertical gate 110 of an embodiment of the inventive concept and the horizontal cross-section of the dual vertical gate DVG of FIG. 2D have a difference that is described below. The horizontal cross-section of the dual vertical gate 110 according to an embodiment of the inventive concept has a peanut shape from a level higher than the first height H1 of the separation area to a level of the reference height H0 of the top surface of the element isolation layer 160. On the other hand, the horizontal cross-section of the dual vertical gate DVG of FIG. 2D has a peanut shape at the level higher than the top surface of the element isolation layer STI and has the shape of two separated circles at a level lower than or to the same as the top surface of the element isolation layer STI.

Moreover, in the dual vertical gate 110 according to an embodiment of the inventive concept, a top surface of a central portion of the connection portion 114 in the first direction (the x direction) is higher than the reference height H0. Grooves G may be formed in both outer portions of the connection portion 114 in the first direction (the x direction). A top surface of the groove G has a second height H2 that is lower than the reference height H0. However, according to an embodiment of the inventive concept, in both outer portions of the connection portion 114 in the first direction (the x direction), step portions are formed without a groove being formed. The top surface of the step portion has a height that is substantially the same as the reference height H0.

The FD region 140 is located in the first active region ACT1 and is spaced apart from the dual vertical gate 110 in the second direction (the y direction). The FD region 140 has a second conductivity type, such as n type, opposite to that of the substrate 101. As may be seen from FIG. 2C, a first portion 101S1 of the substrate 101 is located between the FD region 140 and the dual vertical gate 110. For example, the first portion 101S1 of the substrate 101 is connected to the separation area SA and is located between the FD region 140 and the dual vertical gate 110.

Pixel transistors are disposed on the second active region ACT2. Thus, the second active region ACT2 corresponds to the TR region 130. At least one of the reset transistor RX, the source follower transistor SFX, or the selection transistor SX is disposed in the TR region 130. For example, all the three transistors can be disposed in the TR region 130. Moreover, according to an embodiment of the inventive concept, the source follower transistor SFX and the selection transistor SX are disposed in the TR region 130 of one pixel and the reset transistor RX is disposed in the TR region 130 of an adjacent pixel PX. In such a structure, two adjacent pixels PX share pixel transistors. In addition, a power voltage contact may be arranged in the TR region 130.

In the image sensor 100 according to an embodiment of the inventive concept, the transfer transistor TX includes the dual vertical gate 110, and the top surface of the separation area SA that separates the two vertical extension portions 112 of the dual vertical gate 110 is lower than the top surface of the element isolation layer 160, and the width of the separation area SA is relatively narrow in the first direction, as compared to the width of the separation area SA. Based on the structure of the dual vertical gate 110, an electric (E) field extends to the entire separation area SA, such that the entire separation area SA acts as a channel region. In addition, as may be seen from an arrow of FIG. 2C, a path from the photodiode PD 120 to the FD region 140 is minimized. As a result, in the image sensor 100 of an embodiment of the inventive concept, the charge transfer characteristics of the transfer transistor TX are maximized.

In contrast, in the structure of the dual vertical gate DVG of FIG. 2D, when the top surface of the separation area SA' is at substantially the same level as the top surface of the element isolation layer STI, the width of the separation area SA' in the first direction (the x direction) is relatively wide, as compared to the width of the separation area SA. As a result, the E-field can be applied only to a portion of the separation area SA adjacent to the dual vertical gate DVG, such that only the portion adjacent to the dual vertical gate DVG acts as a channel region. In addition, as may be seen from an arrow of FIG. 2D, a path from the photodiode PD 120 to the FD region 140 is relatively long, as compared to the path in FIG. 2C. As a result, the charge transfer characteristics of a transfer transistor that includes the dual vertical gate DVG of FIG. 2D might be poor.

In addition, in the image sensor 100 of an embodiment of the inventive concept, based on the structure of the dual vertical gate 110, a process margin in patterning can be sufficiently secured, and the size of the dual vertical gate 110 can be minimized. Consequently, the image sensor 100 of an embodiment of the inventive concept can implement fine pixels. Moreover, in terms of securing full well capacity (FWC), the image sensor 100 of an embodiment of the inventive concept is suitable for a deepening silicon structure.

The process of securing the process margin and reducing the size through a process of forming the dual vertical gate 110 will be described as follows. First, two trenches for two vertical extension portions are formed in the substrate 101. That is, a photoresist (PR) pattern that includes open portions that correspond to the two trenches is formed, and the substrate is etched using the PR pattern as a mask to form the two trenches. The open portions that correspond to the two trenches are formed close to each other, as will be apparent below. Thereafter, when etching is performed, the PR portion between the open portions is entirely removed, and an upper portion of the substrate 101 that corresponds to the removed PR portion is removed. Thus, upper portions of the two trenches meet each other. In addition, when the element isolation layer 160 is formed on either side, the substrate 101 on the element isolation layer 160 side, that is, silicon, is etched faster. Thereafter, the dual vertical gate 110 is formed by filling the two trenches with an insulating material and polysilicon and patterning the insulating material and the polysilicon.

During an etching process of the substrate 101, the upper portions of the trenches meet each other, and as the silicon on the element isolation layer 160 is etched faster, the structure of the separation area SA will automatically acquire the structure shown in FIGS. 2B and 2C. Therefore, by slightly changing only the shape of the PR pattern, the image sensor 100 of the current embodiment of the inventive concept can be easily implemented without changing the process. Further, when the trench is formed, there is no need to precisely calculate the size of the corresponding PR pattern. For example, it is not necessary to precisely match spacings between the open portions of the PR pattern, and only a small amount of the PR remains between the open portions such that the etching is performed less than in the open portions. Accordingly, the process margin is sufficient and the spacings can be reduced. As a result, the size of the dual vertical gate 110 is minimized.

FIGS. 3A through 3E are cross-sectional views of a pixel of an image sensor according to embodiments of the inventive concept, each of which corresponds to the cross-sectional view of FIG. 2B.

Figure 3A:
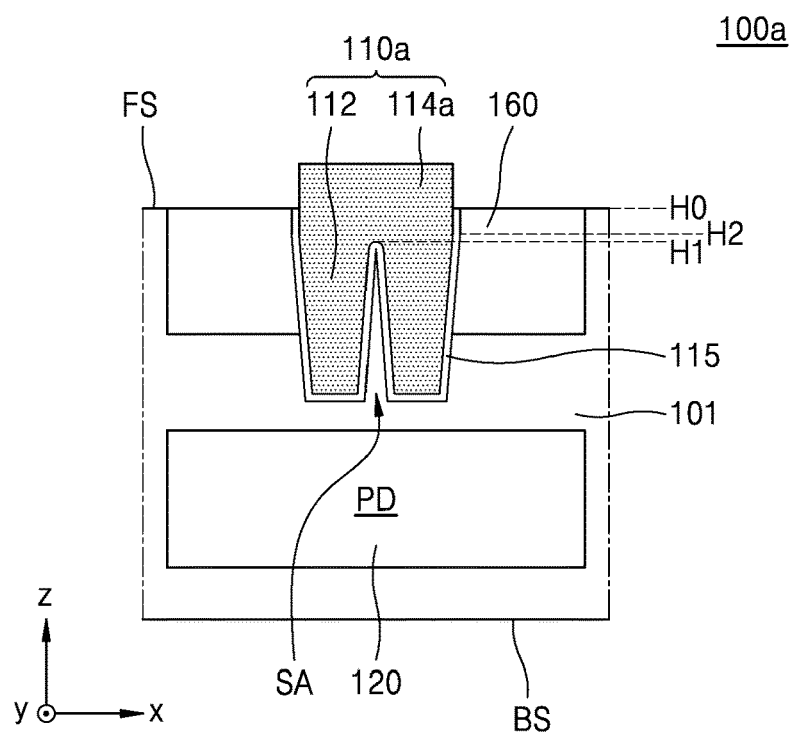
FIGS. 3A through 3E are cross-sectional views of a pixel of an image sensor that includes a dual vertical gate according to embodiments of the inventive concept.

Referring to FIG. 3A, an image sensor 100a according to an embodiment of the inventive concept differs from the image sensor 100 of FIG. 2B in a structure of a dual vertical gate 110a. More specifically, in the image sensor 100a an current embodiment of the inventive concept, no groove is formed in a connection portion 114a of the dual vertical gate 110a. That is, the entire top surface of the connection portion 114a has substantially the same height. However, the shapes of the vertical extension portion 112 and the separation area SA are substantially the same as the shapes of the vertical extension portion 112 and the separation area SA of the image sensor 100 of FIG. 2B.

Figure 3B:
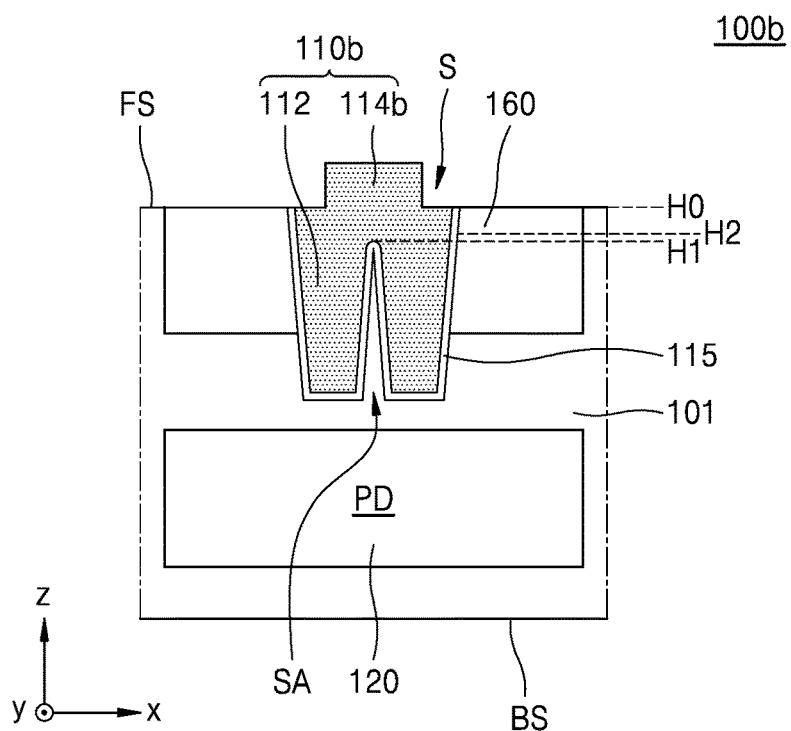

Referring to FIG. 3B, an image sensor 100b according to an embodiment of the inventive concept differs from the image sensor 100 of FIG. 2B in a structure of a dual vertical gate 110b. More specifically, in the image sensor 100b of an embodiment of the inventive concept, a step portion S is formed in a connection portion 114b, instead of a groove. In addition, the top surface of the stepped portion S has substantially the same height as the reference height H0 of the element isolation layer 160. However, the shapes of the vertical extension portion 112 and the separation area SA are substantially the same as the shapes of the vertical extension portion 112 and the separation area SA of the image sensor 100 of FIG. 2B.

Figure 3C:
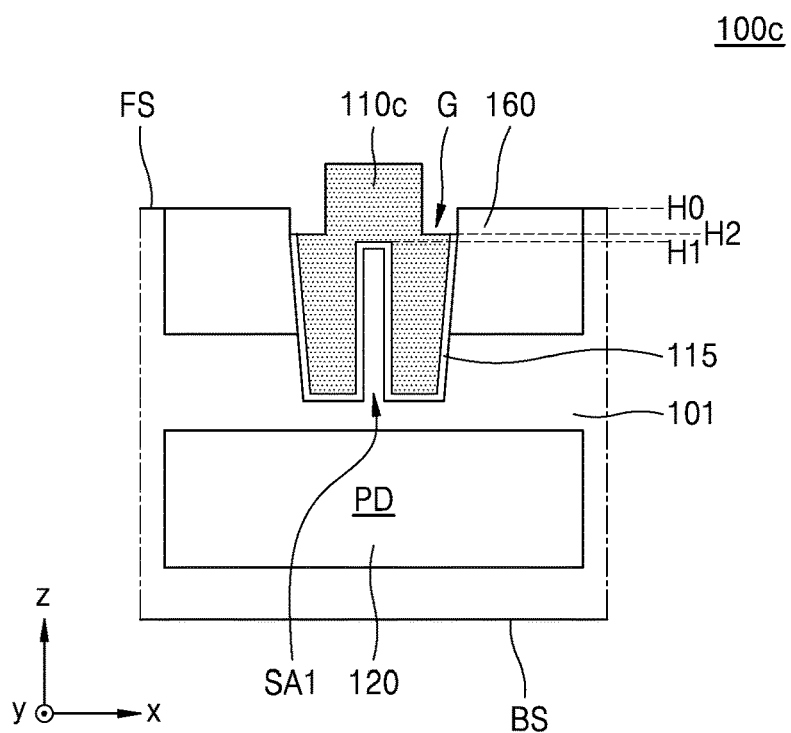

Referring to FIG. 3C, an image sensor 100c according to an embodiment of the inventive concept differs from the image sensor 100 of FIG. 2B in a structure of a dual vertical gate 110c. More specifically, in the image sensor 100b of an embodiment of the inventive concept, a separation area SA1 of the dual vertical gate 110c has a rectangular cross-section perpendicular to the second direction (the y direction) and parallel to the first direction (the x direction). The shape of the cross-section of the separation area SA1 is implemented by increasing the spacing between the open portions of the PR pattern when a trench for a vertical extension portion is formed. In FIG. 3C, the height of the top surface of the separation area SA1 is indicated as the first height H1, but according to an embodiment of the inventive concept, the height of the top surface of the separation area SA1 may be higher than that of the top surface of the separation area SA of the image sensor 100 of FIG. 2B.

Figure 3D:
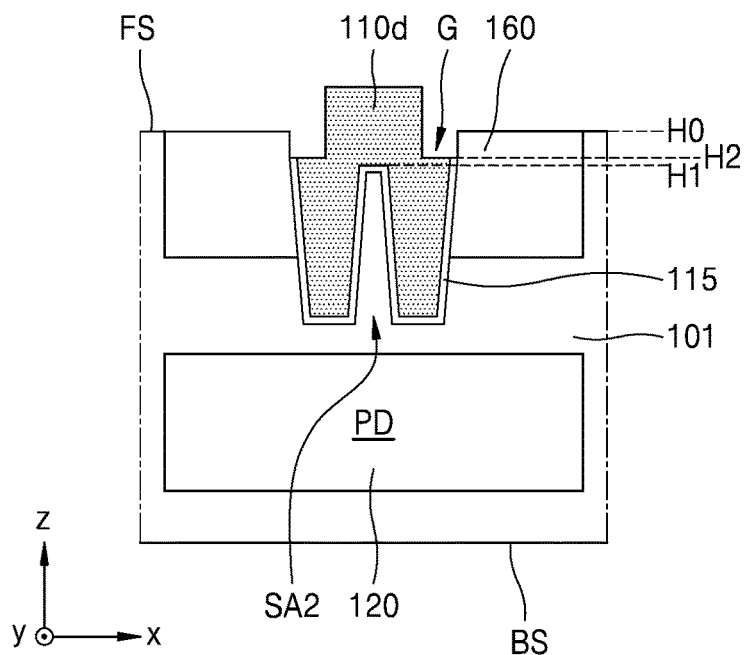

Referring to FIG. 3D, an image sensor 100d according to an embodiment of the inventive concept differs from the image sensor 100 of FIG. 2B in a structure of a dual vertical gate 110d. More specifically, in the image sensor 100d of an embodiment of the inventive concept, a separation area SA2 of the dual vertical gate 110d has a trapezoidal cross-section perpendicular to the second direction (the y direction) and parallel to the first direction (the x direction). The shape of the cross-section of the separation area SA2 is implemented by increasing the spacing between the open portions of the PR pattern when a trench for a vertical extension portion is formed.

In addition, a difference in a cross-sectional shape between the separation area SA1 of the image sensor 100c of FIG. 3C and the separation area SA2 of the image sensor 100d of an embodiment of the inventive concept originates from differences in a vertical structure of a trench in the etching process rather than differences in a PR pattern. For example, when the trench is vertically formed through a precise etching process, a cross-sectional shape of the separation area SA1 of the image sensor 100c of FIG. 3C may be formed, and when the trench is formed with a shape that narrows toward the bottom, as in a general etching process, the cross-sectional shape of the separation area SA2 of the image sensor 100d of an embodiment of the inventive concept is formed.

Figure 3E:
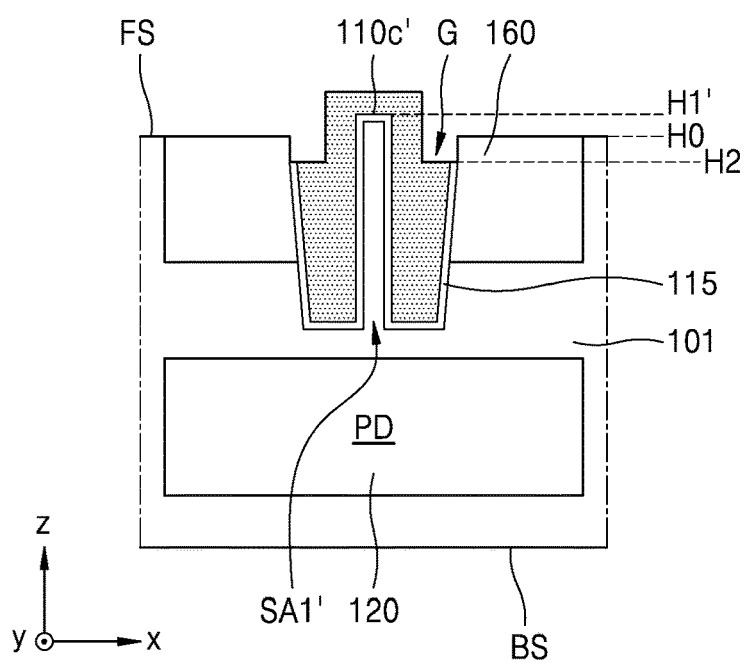

Referring to FIG. 3E, an image sensor 100e according to an embodiment of the inventive concept is substantially similar to the image sensor 100c of FIG. 3C, except that the top surface of the separation area SA1' of the image sensor 100e according to an embodiment of FIG. 3E is higher than the top surface of the separation area SA1 of the image sensor 100c of FIG. 3C. For example, in the image sensor 100e of an embodiment of FIG. 3E, the first height H1' of the top surface of the separation area SA1', is higher than the reference height H0 of the element isolation layer 160. The shape of the cross-section of the separation area SA1' of the image sensor 100e of an embodiment of FIG. 3E is implemented by increasing the spacing between the open portions of the PR pattern when a trench for a vertical extension portion is formed. For example, the spacing between the open portions of the PR pattern when a trench is formed in the image sensor 100e of an embodiment of FIG. 3E is substantially equal to or greater than the spacing between the open portions of the PR pattern when a trench for the dual vertical gate DVG of FIG. 2D is formed.

Figure 4A:
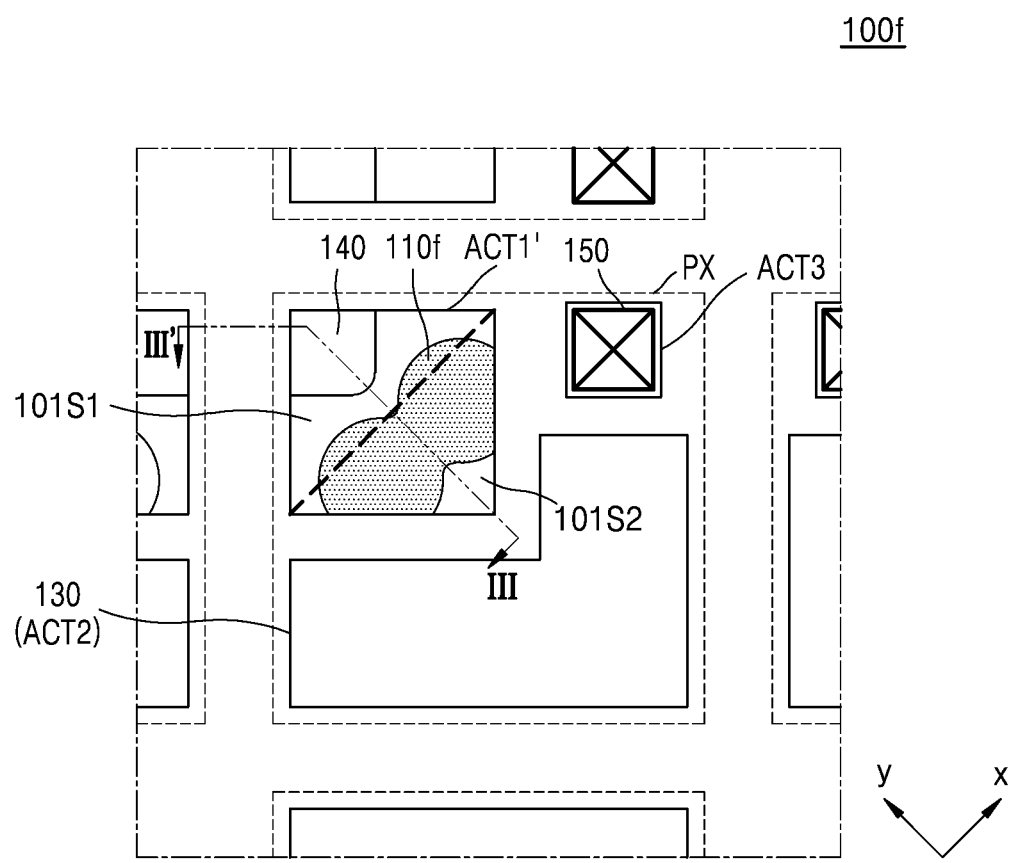
FIGS. 4A and 4B are a plan view and a cross-sectional view of a pixel of an image sensor that includes a dual vertical gate, according to an embodiment of the inventive concept.
Figure 4B:
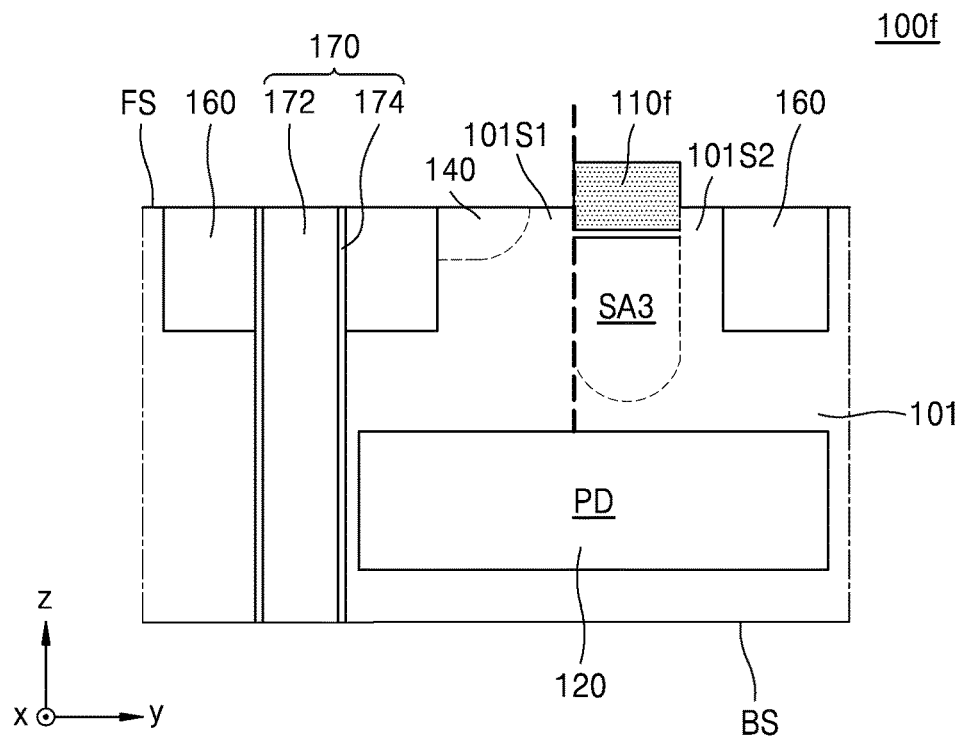

FIGS. 4A and 4B are a plan view and a cross-sectional view of a pixel of an image sensor according to an embodiment of the inventive concept. FIG. 4B is a cross-sectional view cut away along a line of FIG. 4A.

Referring to FIGS. 4A and 4B, an image sensor 100f according to an embodiment of the inventive concept differs from the image sensor 100 of FIG. 2A in the form of a first active region ACT1'. More specifically, in the image sensor 100 of FIG. 2A, in a planar view, the first active region ACT1 has a substantially rectangular shape, and a right outer portion of the first active region ACT1 in the second direction (they direction) is limited by a side surface of the dual vertical gate 110, so that a notch is formed in a right-side corner in the second direction. On the other hand, in the image sensor 100f of an embodiment of FIG. 4A, the first active region ACT1' has a rectangular shape in a planar view, and includes a second portion 101S2 of the substrate 101 outside a dual vertical gate 110f at the right-side corner in the second direction. For example, the right outer portion of the first active region ACT1' in the second direction (the y direction) is not limited by the side surface of the dual vertical gate 110f.

Since the second portion 101S2 of the substrate 101 is located on the right outer portion of the first active region ACT1' in the second direction (the y direction), an etching speed of the substrate 101 is substantially identical on both sides of the dual vertical gate 110f in the second direction (the y direction). As shown in FIG. 4B, a height of a top surface of a separation area SA3 is substantially the same in the second direction (the y direction). For example, the top surface of a separation area SA3 is parallel to a top surface of the substrate 101. In addition, the height of the separation area SA3 is higher than the first height H1, the height of the top surface of the separation area SA of the image sensor 100 of FIG. 2B. However, the height of the top surface of the separation area SA3 is lower than the height of the top surface of the element isolation layer 160. In addition, the cross-section of the separation area SA3 perpendicular to the second direction (the y direction) has a triangular shape, as shown in FIG. 2B. However, embodiments are not limited thereto, and in other embodiments, the cross-section of the separation area SA3 has a rectangular shape or a trapezoidal shape, as shown in FIG. 3C or 3D.

Figure 5A:
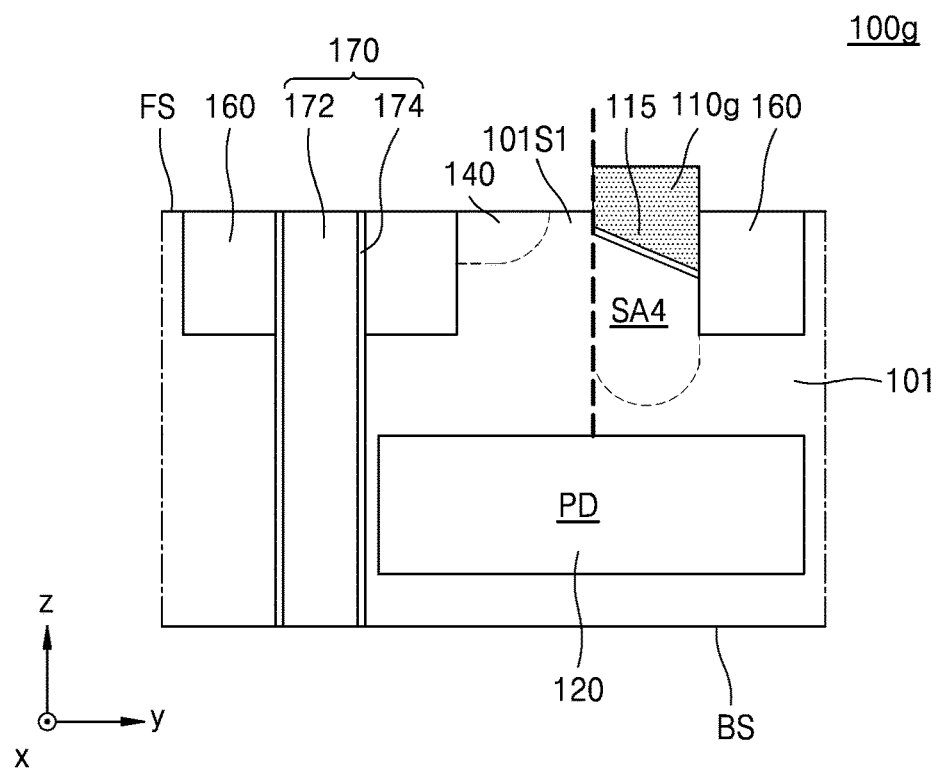
FIGS. 5A through 5C are cross-sectional views of an image sensor that includes a dual vertical gate according to embodiments of the inventive concept.
Figure 5B:
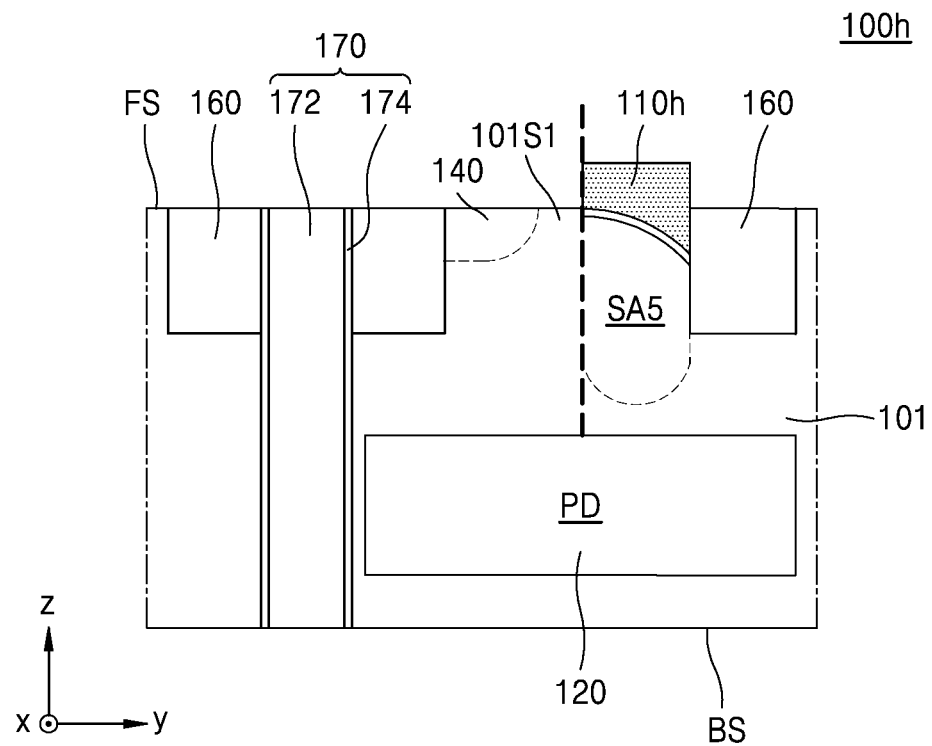
Figure 5C:
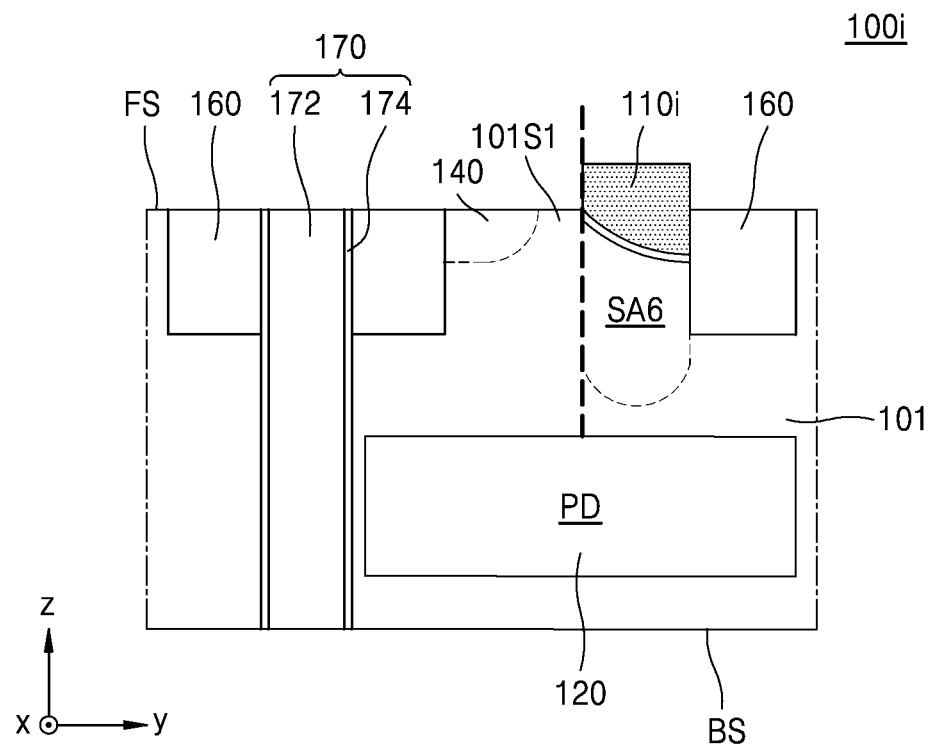

FIGS. 5A through 5C are cross-sectional views of an image sensor according to embodiments of the inventive concept, each of which corresponds to the cross-sectional view of FIG. 2C.

Referring to FIG. 5A, an image sensor 100g according to an embodiment of the inventive concept differs from the image sensor 100 of FIG. 2C in a structure of a dual vertical gate 110g. More specifically, in the image sensor 100g an current embodiment of the inventive concept, the dual vertical gate 110g has a shape in which the height of the top surface of a separation area SA4 gradually increases in the second direction (the y direction), but as can be seen from the thick dashed line of FIG. 5A, a height of the top surface of the separation area SA4 is lower than the reference height H0 of the element isolation layer 160 in the outermost portion of the dual vertical gate 110g in the second direction (the y direction). As a result, the height of the entire top surface of the separation area SA4 is lower than the reference height H0 of the element isolation layer 160.

Referring to FIG. 5B, an image sensor 100h according to an embodiment of the inventive concept differs from the image sensor 100 of FIG. 2C in a structure of a dual vertical gate 110h. More specifically, in the image sensor 100h of an embodiment of the inventive concept, the dual vertical gate 110h has a shape in which a height of a top surface of a separation area SA5 gradually increases in the second direction (the y direction) toward the FD region 140, the shape being convex upward. Thus, the bottom surface of the dual vertical gate 110h has an upward concave shape in a portion corresponding to the center of the peanut.

Referring to FIG. 5C, an image sensor 100i according to an embodiment of the inventive concept differs from the image sensor 100 of FIG. 2C in a structure of a dual vertical gate 110i. More specifically, in the image sensor 100i of an embodiment of the inventive concept, the dual vertical gate 110i has a shape in which a height of a top surface of a separation area SA6 gradually increases in the second direction (the y direction) toward the FD region 140, the shape being concave downward. Thus, the bottom surface of the dual vertical gate 110i has a downward convex shape in a portion corresponding to the center of the peanut.

Figure 6A:
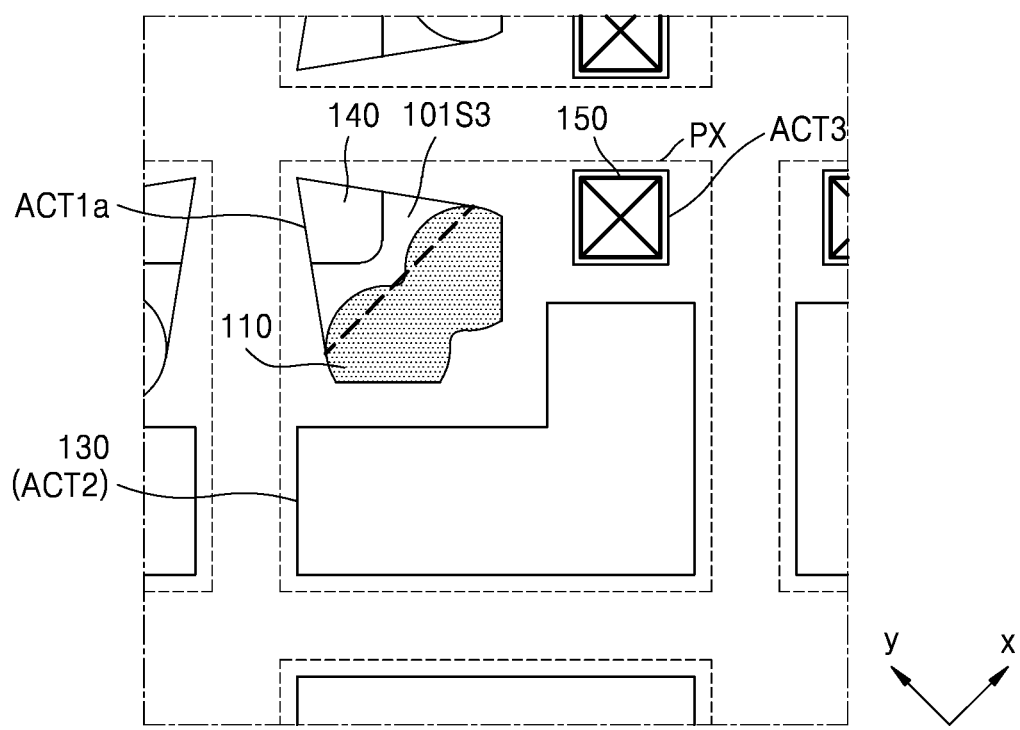
FIGS. 6A and 6B are plan views of a pixel of an image sensor that includes a dual vertical gate according to embodiments of the inventive concept.
Figure 6B:
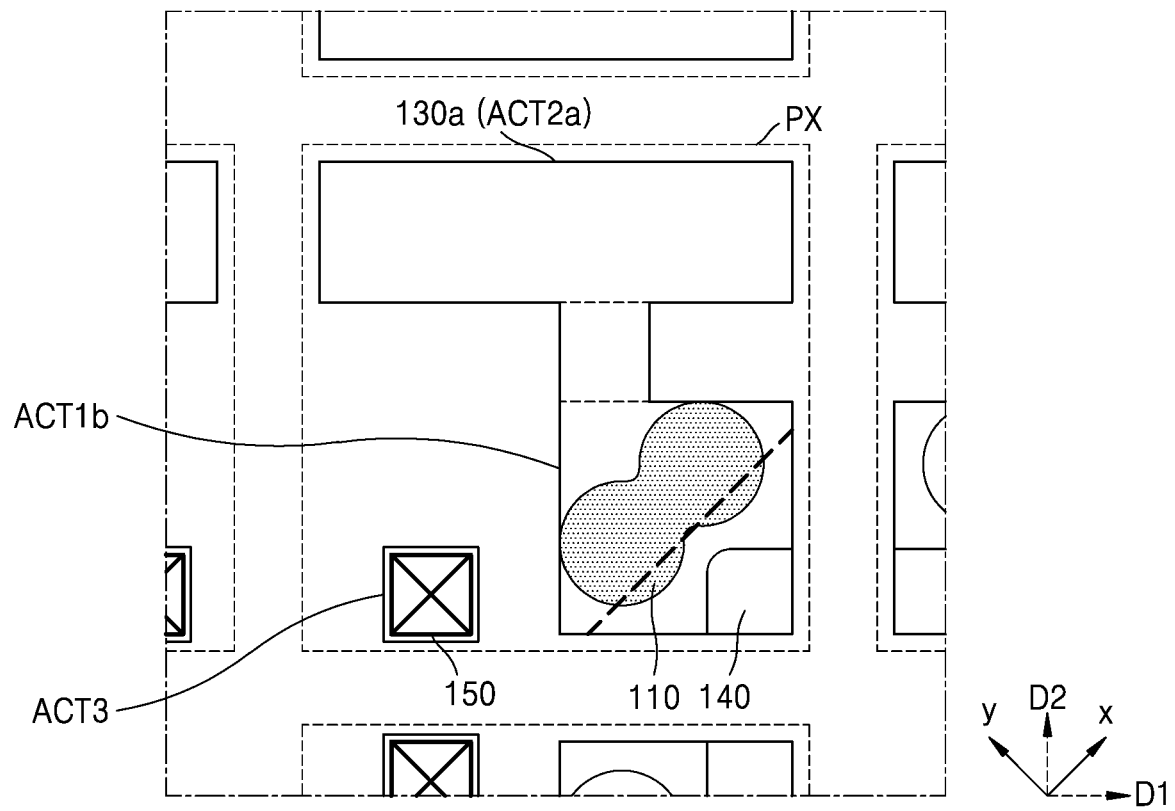

FIGS. 6A and 6B are plan views of a pixel of an image sensor according to embodiments of the inventive concept, each of which corresponds to the plan view of FIG. 2A.

Referring to FIG. 6A, an image sensor 100j according to an embodiment of the inventive concept differs from the image sensor 100 of FIG. 2A in the form of a first active region ACT1a. More specifically, in the image sensor 100j of an embodiment of the inventive concept, in a plan view, the first active region ACT1a has an approximately triangular shape, and a right outer portion of the first active region ACT1a in the second direction (the y direction) is limited by a side surface of the dual vertical gate 110, where a notch is formed in a right-side corner in the second direction. In addition, a first portion 101S3 of the substrate 101 is located between the dual vertical gate 110j and the FD region 140. Since the first active region ACT1a has a triangular shape, the first portion 101S3 of the substrate 101 has a shape that differs from that of the first portion 101S1 of the substrate 101 in the image sensor 100 of FIG. 2A.

Referring to FIG. 6B, an image sensor 100k according to an embodiment of the inventive concept differs from the image sensor 100 of FIG. 2A in the form of active regions. More specifically, in the image sensor 100k of an embodiment of the inventive concept, a first active region ACT1b and a second active region ACT2a are connected to each other. In addition, in a plan view, the connected active regions have a T shape.

A part of a connection portion that connects the first active region ACT1b with the second active region ACT2a corresponds to the second portion of the substrate 101, so that the first active region ACT1b has a structure similar to that of the first active region ACT1' of FIG. 4A. In addition, the second active region ACT2a has a line shape that extends in the first diagonal direction D1. In addition, based on the shape of the second active region ACT2a, a TR region 130a also has a line shape that extends in the first diagonal direction D1.

Figure 7A:
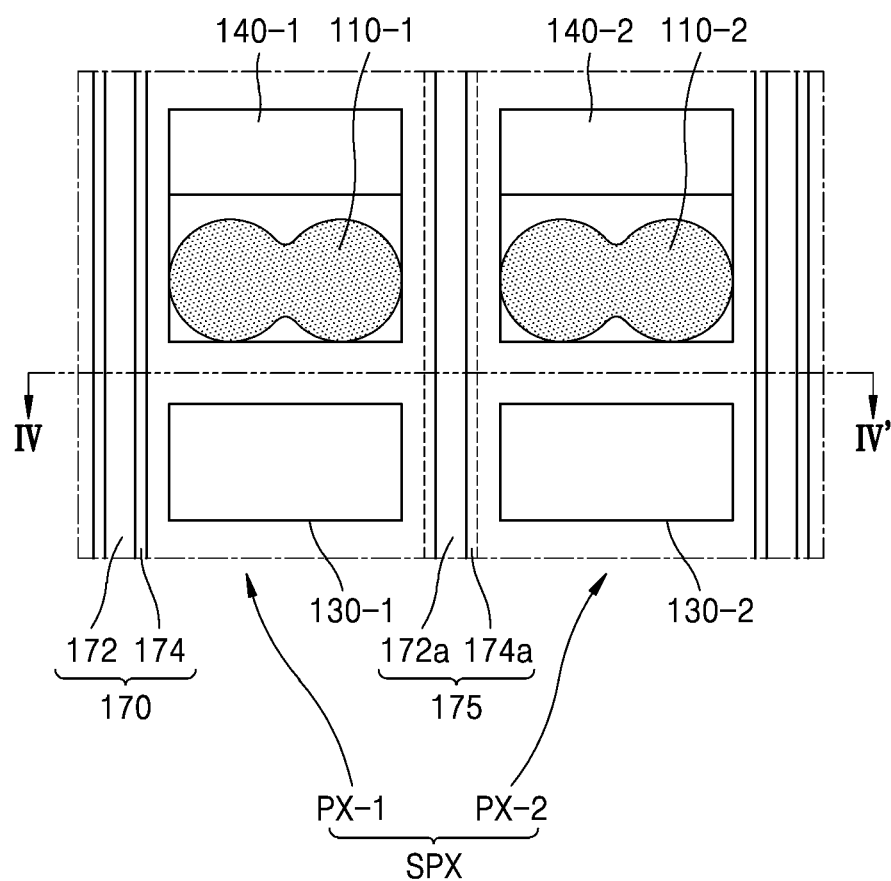
FIGS. 7A and 7B are a plan view and a cross-sectional view of a pixel of an image sensor that includes a dual vertical gate, according to an embodiment of the inventive concept.
Figure 7B:
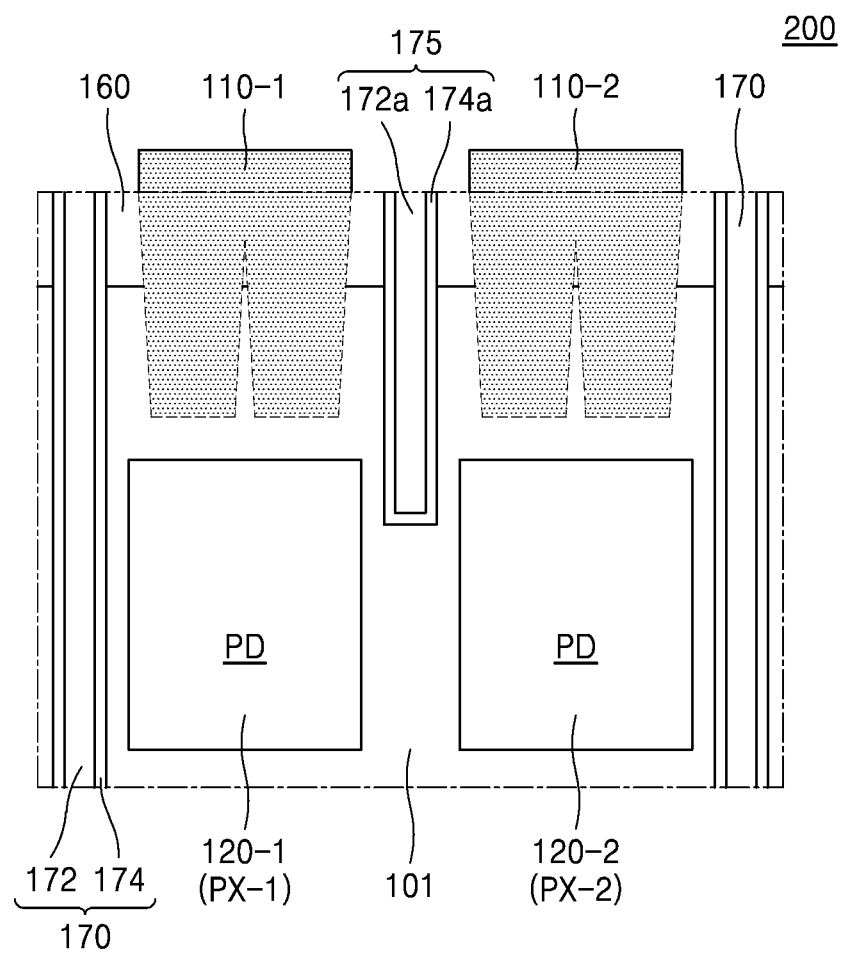

FIGS. 7A and 7B are a plan view and a cross-sectional view of a pixel of an image sensor according to an embodiment of the inventive concept. FIG. 7B is a cross-sectional view taken along a line IV-IV' of FIG. 7A.

Referring to FIGS. 7A and 7B, an image sensor 200 according to an embodiment of the inventive concept differs from the image sensor 100 of FIG. 2A in that the image sensor 200 includes a sharing pixel SPX. More specifically, in the image sensor 200 according to an embodiment of the inventive concept, the sharing pixel SPX includes a first pixel PX-1 and a second pixel PX-2. The first pixel PX-1 includes a first dual vertical gate 110-1, a first photodiode 120-1, a first TR region 130-1, and a first FD region 140-1, and the second pixel PX-2 includes a second dual vertical gate 110-2, a second photodiode 120-2, a second TR region 130-2, and a second FD region 140-2. In addition, different pixel transistors are disposed in the first TR region 130-1 and the second TR region 130-2, and the first pixel PX-1 and the second pixel PX-2 share the pixel transistors. For example, the reset transistor RX is disposed in the first TR region 130-1, and the source follower transistor SFX and the selection transistor SX are disposed in the second TR region 130-2.

The sharing pixel SPX is surrounded by the pixel isolation structure 170 and electrically insulated from other sharing pixels. In addition, in the sharing pixel SPX, the first pixel PX-1 and the second pixel PX-2 are half-separated by a sharing pixel isolation structure 175. For example, as shown in FIG. 7B, the sharing pixel isolation structure 175 has a structure that penetrates only a portion of the substrate 101, rather than entirely penetrating the substrate 101. Thus, the first pixel PX-1 and the second pixel PX-2 share a lower portion of the substrate 101 with each other. In addition, the sharing pixel isolation structure 175 includes a conductive layer 172a and an insulating layer 174a, similar to the pixel isolation structure 170.

In addition, in the image sensor 200 of an embodiment of the inventive concept, each of the first dual vertical gate 110-1 of the first pixel PX-1 and the second dual vertical gate 110-2 of the second pixel PX-2 has a structure in which a top surface of a separation area is lower than a top surface of the element isolation layer 160. In FIG. 7B, buried portions of the first dual vertical gate 110-1 and the second dual vertical gate 110-2 are indicated by dashed lines. Although the vertical cross-sections of the separation regions of the first and second dual vertical gates 110-1 and 110-2 are shown as having a triangular shape, the vertical cross-sections of the separation regions are not limited to a triangular shape.

Figure 8:
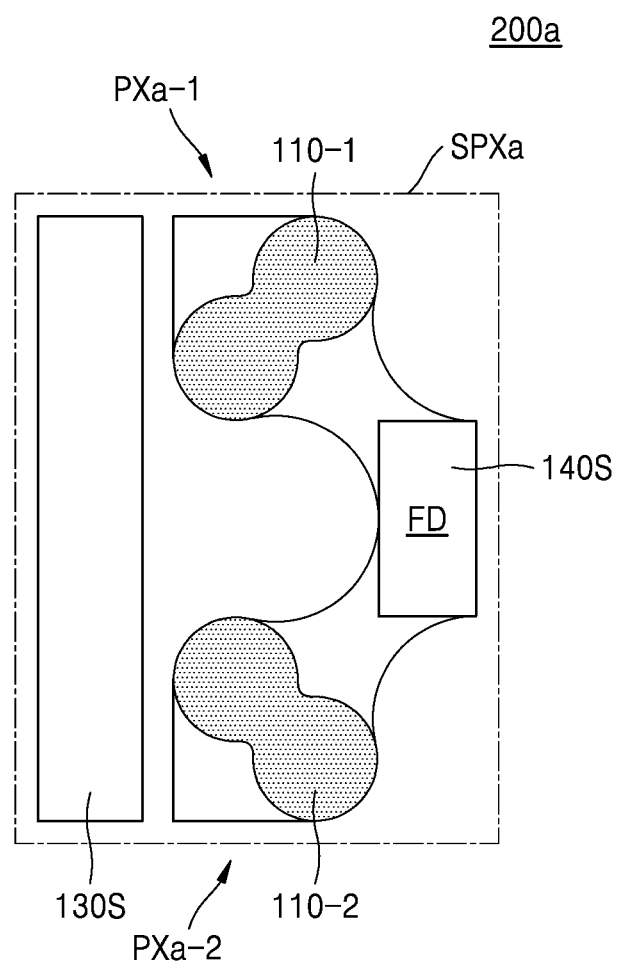
FIG. 8 is a plane view of a pixel of an image sensor that includes a dual vertical gate, according to an embodiment of the inventive concept.

FIG. 8 is a plan view of a pixel of an image sensor according to an embodiment of the inventive concept.

Referring to FIG. 8, an image sensor 200a according to an embodiment of the inventive concept is similar to the image sensor 200 of FIG. 7A in that a sharing pixel SPXa includes two pixels PXa-1 and PXa-2. However, the image sensor 200a of an embodiment of the inventive concept differs from the image sensor 200 of FIG. 7A in that the two pixels PXa-1 and PXa-2 share an FD region 140S and a TR region 130S.

More specifically, in the image sensor 200a of an embodiment of the inventive concept, information about the charges generated by the photodiode of each of the first pixel PXa-1 and the second pixel PXa-2 is output using the FD region 140S and the TR region 130S in common. Moreover, the first pixel PXa-1 and the second pixel PXa-2 are distinguished from each other by regulating on-off of the dual vertical gates 110-1 and 110-2. In addition, the reset transistor RX, the source follower transistor SFX, and the selection transistor SX are disposed in the TR region 130S. A circuit diagram of the sharing pixel SPXa of the image sensor 200a of an embodiment of the inventive concept corresponds to sharing the FD region 140S by two pixels instead of four pixels in the circuit diagram of FIG. 10B, described below.

Furthermore, in the image sensor 200a of an embodiment of the inventive concept, each of the first dual vertical gate 110-1 of the first pixel PX-1 and the second dual vertical gate 110-2 of the second pixel PX-2 has a structure in which the top surface of the separation area is lower than the top surface of the element isolation layer 160.

Figure 9A:
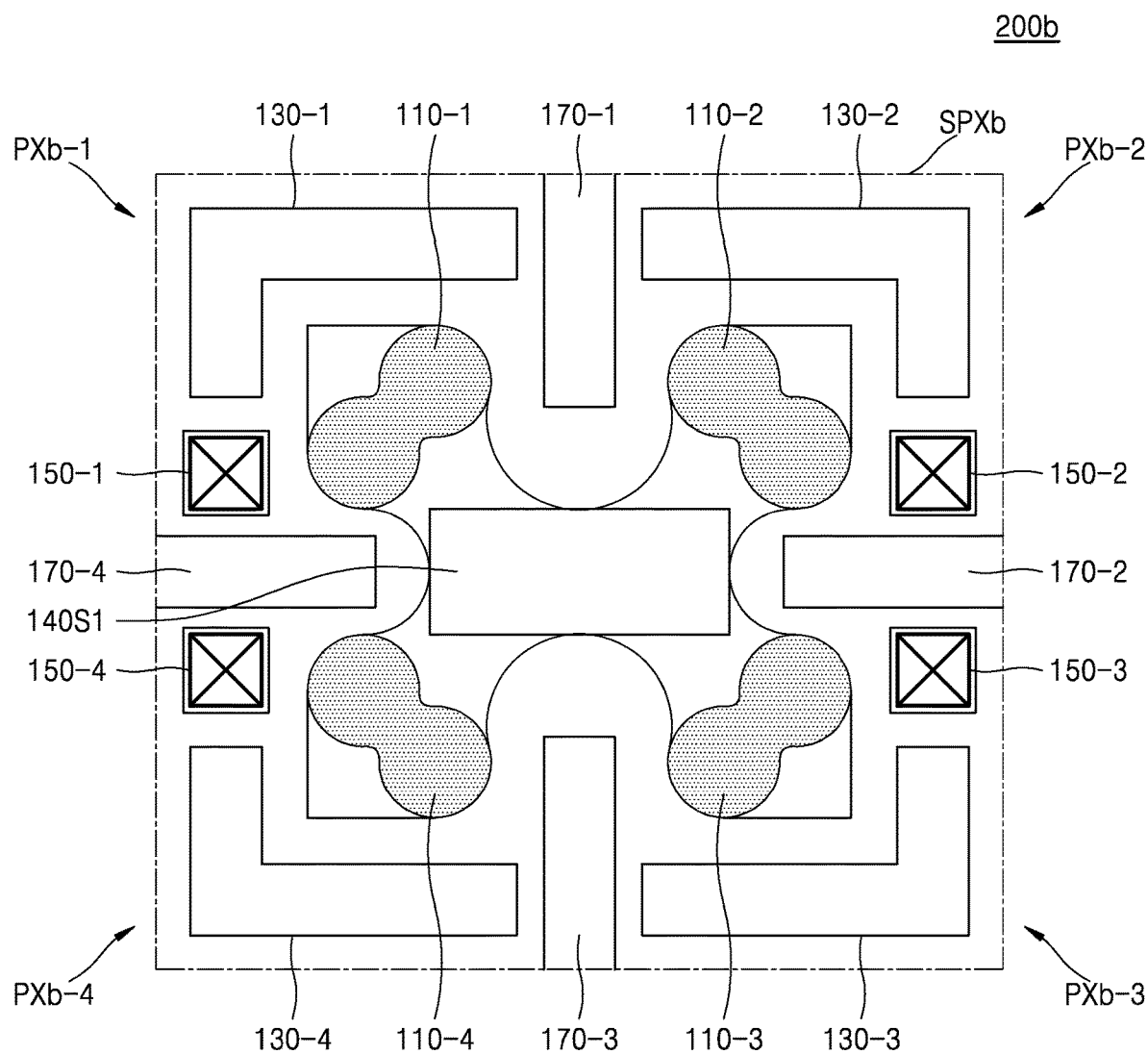
FIGS. 9A and 9B are plan views of a pixel of an image sensor that includes a dual vertical gate according to an embodiment of the inventive concept.
Figure 9B:
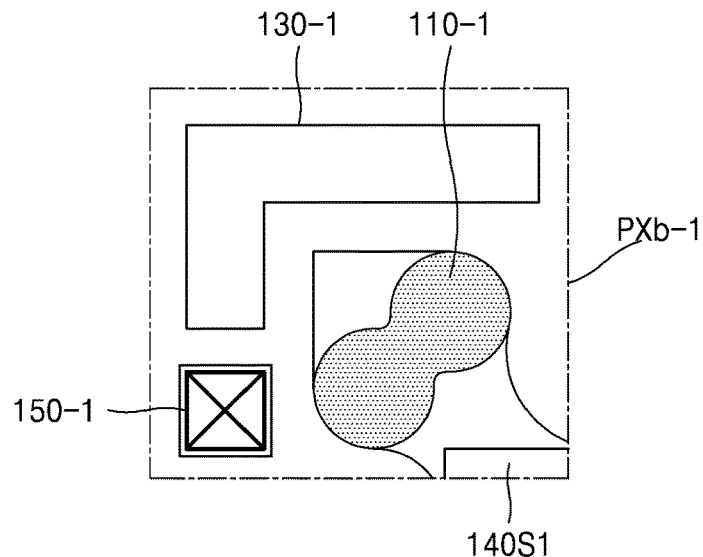

FIGS. 9A and 9B are plan views of a pixel of an image sensor according to an embodiment of the inventive concept. FIG. 9B is a plan view showing a portion corresponding to a pixel in FIG. 9A.

Referring to FIGS. 9A and 9B, an image sensor 200b according to an embodiment of the inventive concept differs from the image sensor 200 or 200a of FIG. 7A or FIG. 8 in that a sharing pixel SPXb includes four pixels PXa-1 through PXa-4. More specifically, in the image sensor 200b of an embodiment of the inventive concept, the shared pixel SPXb include the four pixels PXb-1 to PXb-4, and the four pixels PXb-1 to PXb-4 share the FD area 140S1. In addition, the four pixels PXb-1 through PXb-4 include corresponding TR regions 130-1 through 130-4, respectively. Each of the TR regions 130-1 through 130-4 includes at least one pixel transistor.

In addition, the four pixels PXb-1 through PXb-4 are separated from one another by the pixel isolation structure 170. However, the sharing pixel SPXb shares the FD region 140S1, such that adjacent pixels may be separated from each other by the pixel isolation structure 170, except for the FD region 140S1. A portion of the sharing pixel SPXb that corresponds to the first pixel PXb-1 is shown in FIG. 9B, where a part of the FD region 140S1 is included in the first pixel PXb-1.

In the image sensor 200b of an embodiment of the inventive concept, each of the dual vertical gates 110-1 through 110-4 of the four pixels PXb-1 through PXb-4 has a structure in which the top surface of the separation area is lower than the top surface of the element isolation layer 160.

Figure 10A:
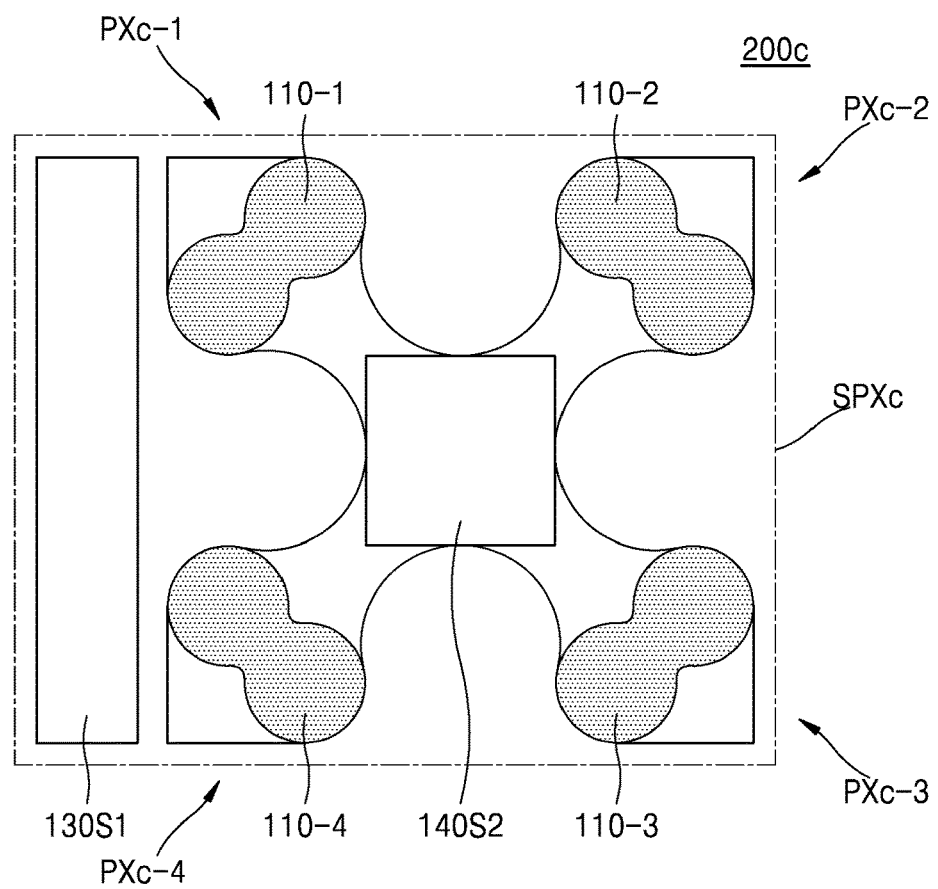
FIGS. 10A and 10B are a plan view and a corresponding circuit diagram of a pixel of an image sensor that includes a dual vertical gate, according to an embodiment of the inventive concept.
Figure 10B:
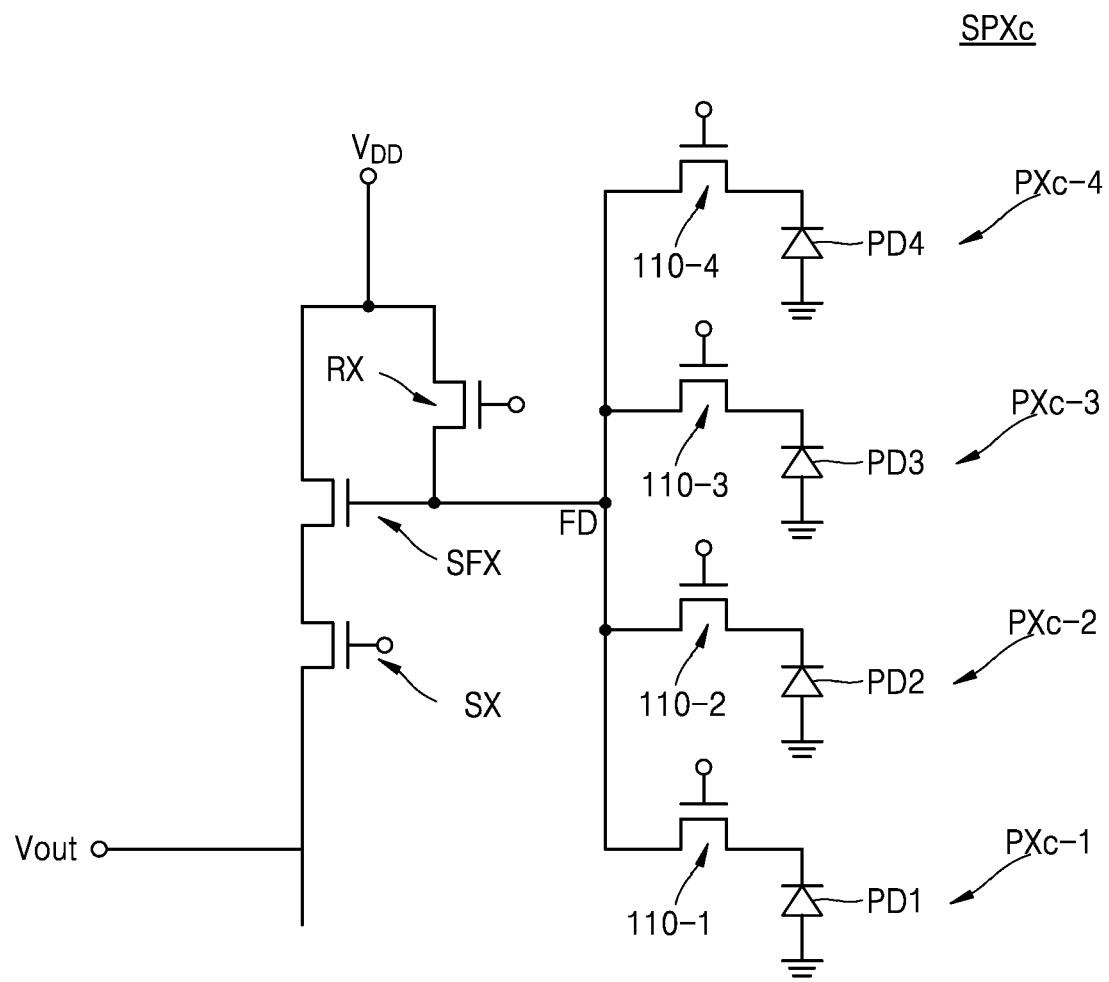

FIG. 10A is a plan view of a pixel of an image sensor according to an embodiment of the inventive concept, and FIG. 10B is a circuit diagram of a sharing pixel of the image sensor of FIG. 10A.

Referring to FIGS. 10A and 10B, an image sensor 200c according to an embodiment of the inventive concept is similar to the image sensor 200b of FIG. 9A in that a sharing pixel SPXc includes four pixels PXc-1 through PXc-4. However, in the image sensor 200c of an embodiment of the inventive concept, the sharing pixel SPXc includes the four pixels PXc-1 to PXc-4, and the four pixels PXc-1 to PXc-4 share an FD area 140S2 and a TR region 130S1.

In the image sensor 200c of an embodiment of the inventive concept, information about the charges generated by the photodiode of each of the four pixels PXc-1 through PXc-4 is output using the FD region 140S2 and the TR region 130S1 in common. Moreover, the four pixels PXc-1 through PXc-4 are distinguished from one another by regulating on-off of the dual vertical gates 110-1 through 110-4. In addition, the reset transistor RX, the source follower transistor SFX, and the selection transistor SX are disposed in the TR region 130S1.

As may be seen from the circuit diagram of FIG. 10B that corresponds to the sharing pixel SPXc of the image sensor 200c of an embodiment of the inventive concept, the sharing pixel SPXc includes four pixels PXc-1 to PXc-4, and include four photodiodes PD1 to PD4 and four dual vertical gates 110-1 to 110-4 that respectively correspond to the four pixels PXc-1 to PXc-4. The four pixels PXc-1 to PXc-4 share the FD region FD, and share the reset transistor RX, the source follower transistor SFX, and the selection transistor SX of the TR region 130S1. A connection structure of the reset transistor RX, the source follower transistor SFX, and the selection transistor SX of the TR region 130S1 to the FD region FD is substantially the same as a connection structure of the reset transistor RX, the source follower transistor SFX, and the selection transistor SX to the FD region FD shown in the circuit diagram of FIG. 1.

In the image sensor 200c of an embodiment of the inventive concept, each of the dual vertical gates 110-1 through 110-4 of the four pixels PXc-1 through PXc-4 has a structure in which the top surface of the separation area is lower than the top surface of the element isolation layer 160.

Figure 11:
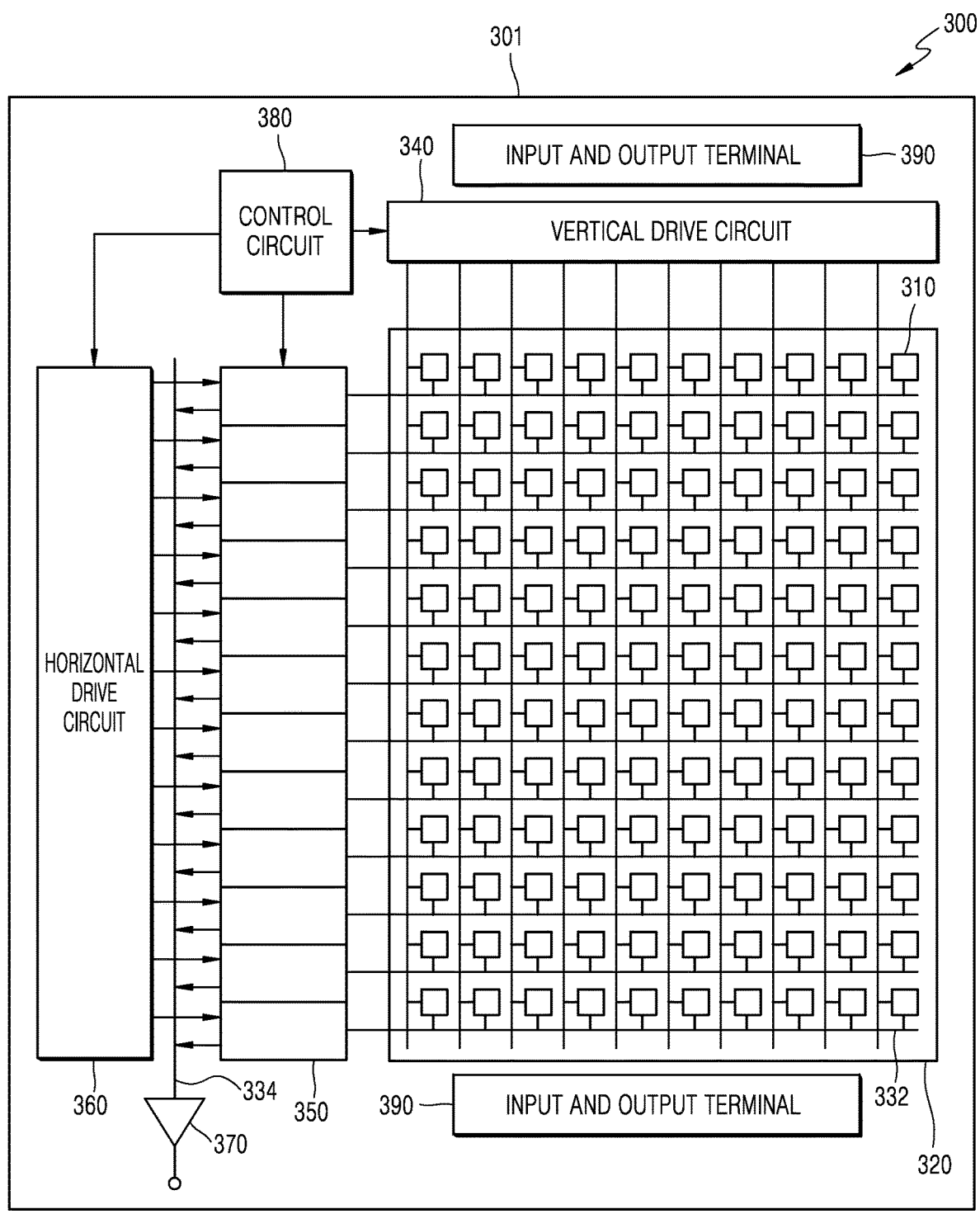
FIG. 11 is a schematic structural view of an image sensor according to an embodiment of the inventive concept.

FIG. 11 is a schematic structural view of an image sensor according to an embodiment of the inventive concept. A description will be made with reference to FIGS. 1 through 2D together.

Referring to FIG. 11, an image sensor 300 of an embodiment of the inventive concept includes a pixel unit 320 and a peripheral circuit unit. The pixel unit 320 includes a plurality of pixels 310 that includes photodiodes on a substrate 301 arranged in a 2D array structure. In addition, the pixels 310 may be any of those included in one of the image sensors 100, 100a to 100k, 200, and 200a to 200c of FIGS. 2A, 3A to 4A, 5A to 7A, 8, 9A, and 10A. In addition, each of the pixels 310 includes a corresponding dual vertical gate.

The peripheral circuit unit is arranged around the pixel unit 320, and includes a vertical drive circuit 340, a column signal processing circuit 350, a horizontal drive circuit 360, an output circuit 370, a control circuit 380, etc.

The control circuit 380 controls the vertical drive circuit 340, the column signal processing circuit 350, the horizontal drive circuit 360, etc. For example, in the control circuit 380, a clock signal or control signals based on which the vertical drive circuit 340, the column signal processing circuit 350, the horizontal drive circuit 360, etc., operate, is generated based on a vertical synchronization signal, a horizontal synchronization signal, and a master clock. The control circuit 380 outputs the clock signal or the control signals to the vertical drive circuit 340, the column signal processing circuit 350, the horizontal drive circuit 360, etc.

The vertical drive circuit 340 includes, for example, a shift register that selects a pixel driving wiring and supplies a pulse for driving a pixel to the selected pixel driving wiring to drive pixels row-by-row. For example, the vertical drive circuit 340 sequentially and selectively scans each pixel 310 of the pixel unit 320 in a vertical direction in units of rows. In addition, a pixel signal that corresponds to charges generated by a photoelectric transformation element of each pixel 310, such as a photodiode, is supplied to the column signal processing circuit 350 through a vertical signal line 332.

The column signal processing circuit 350 is provided for each column of the pixels 310 and performs signal processing, such as noise cancellation, for each pixel column based on a signal output from the pixels 310 one of a row. For example, the column signal processing circuit 350 performs signal processing such as correlated-double sampling (CDS), signal amplification, AD conversion, etc., that cancels noise inherent to the pixel 310. A horizontal selection switch is installed at the output terminal of the column signal processing circuit 350.

The horizontal drive circuit 360 includes, for example, a shift register, and sequentially outputs horizontal scan pulses to sequentially select each column signal processing circuit 350, thus outputting a pixel signal of each column signal processing circuit 350 to a horizontal signal line 334.

The output circuit 370 processes and outputs signals sequentially received from each column signal processing circuit 350 through the horizontal signal line 334. For example, the output circuit 370 may only perform buffering, or may perform black level adjustment, column non-uniformity correction, various digital signal processing, etc. In addition, an input/output terminal 390 exchanges signals with the outside.

While embodiments of the inventive concept have been particularly shown and described with reference to the drawings, it will be understood that various changes in form and details may be made therein without departing from the spirit and scope of the following claims.

What is claimed is:

1. An image sensor, comprising:
    a substrate comprising a front side and a back side opposing the front side; and
    a dual vertical gate that includes a first vertical extension portion, a second vertical extension portion spaced apart from the first vertical extension portion in a first direction by a separation area, and a connection portion that connects the first vertical extension portion and the second vertical extension portion,
    wherein each of the first and second vertical extension portions vertically extends in a third direction perpendicular to the first direction into a substrate from the front side of the substrate to the back side of the substrate,
    wherein the separation area has a top surface and a bottom surface opposing the top surface,
    wherein a distance from the top surface of the separation area to the front side of the substrate in the third direction is shorter than a distance from the bottom surface of the separation area to the front side of the substrate in the third direction,
    wherein the top surface of the separation area is spaced apart from the front side of the substrate in the third direction,
    wherein the top surface of the separation area is disposed in the substrate,
    wherein the first vertical extension portion has a first width at a level of the top surface of the separation area in the first direction and has a second width at a level of the bottom surface of the separation area in the first direction, and
    wherein the second width is smaller than the first width.

2. The image sensor of claim 1, wherein a width of the bottom surface of the separation area in the first direction is shorter than the second width of the first vertical extension portion.

3. The image sensor of claim 1, wherein the first vertical extension portion has a first side surface and a second side surface opposing the first side surface in a vertical view,
wherein the first side surface of the first vertical extension portion is in contact with the separation area, and
wherein the second side surface of the first vertical extension portion is inclined in the third direction.

4. The image sensor of claim 3, wherein the second side surface of the first vertical extension portion is inclined in the third direction toward the separation area.

5. The image sensor of claim 3, further comprising:
an element isolation layer disposed directly adjacent to the second side surface of the first vertical extension portion.

6. The image sensor of claim 1, wherein a width of the separation area in the first direction increases in the third direction from the top surface of the separation area to the bottom surface of the separation area.

7. The image sensor of claim 1, wherein the separation area is filled with silicon.

8. An image sensor, comprising:
a substrate comprising a front side and a back side opposing the front side; and
a dual vertical gate that includes a first vertical extension portion, a second vertical extension portion spaced apart from the first vertical extension portion in a first direction by a separation area, and a connection portion that connects the first vertical extension portion and the second vertical extension portion,
wherein each of the first and second vertical extension portions vertically extends in a third direction perpendicular to the first direction into a substrate from the front side of the substrate to the back side of the substrate,
wherein the separation area has a top surface and a bottom surface opposing the top surface,
wherein a distance from the top surface of the separation area to the front side of the substrate in the third direction is shorter than a distance from the bottom surface of the separation area to the front side of the substrate in the third direction,
wherein the top surface of the separation area is spaced apart from the front side of the substrate in the third direction,
wherein the top surface of the separation area is disposed in the substrate, and
wherein a width of the bottom surface of the separation area in the first direction is smaller than a distance from the bottom surface of the separation area to the front side of the substrate.

9. The image sensor of claim 8, wherein the first vertical extension portion and the second vertical extension portion meet at the top surface of the separation area.

10. The image sensor of claim 8, wherein a width of the top surface of the separation area in the first direction is smaller than a width of first vertical extension portion at a level of the bottom surface of the separation area in the first direction.

11. The image sensor of claim 8, wherein the first vertical extension portion has a first side surface and a second side surface opposing the first side surface in a vertical view,
wherein the first side surface of the first vertical extension portion is in contact with the separation area, and
wherein the second side surface of the first vertical extension portion is inclined in the third direction.

12. The image sensor of claim 11, wherein the second side surface of the first vertical extension portion is inclined in the third direction toward the separation area.

13. The image sensor of claim 8, wherein the separation area is filled with silicon that forms the substrate.

14. The image sensor of claim 8, wherein a width of the separation area in the first direction increases in the third direction.

* * * * *